(12) United States Patent
Baek et al.

(10) Patent No.: US 10,553,578 B2
(45) Date of Patent: Feb. 4, 2020

(54) ELECTRONIC DEVICE AND METHOD FOR OPERATING THE SAME

(71) Applicant: Samsung Electronics Co., Ltd., Gyeonggi-do (KR)

(72) Inventors: Jongjin Baek, Incheon (KR); Dongchul Song, Gyeonggi-do (KR); Yongbok Lee, Gyeonggi-do (KR); Jaeyoung Jang, Gyeonggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 353 days.

(21) Appl. No.: 15/616,132

(22) Filed: Jun. 7, 2017

(65) Prior Publication Data
US 2018/0012884 A1 Jan. 11, 2018

(30) Foreign Application Priority Data

Jul. 5, 2016 (KR) ........................ 10-2016-0084773

(51) Int. Cl.
*H01L 27/00* (2006.01)
*H01L 27/02* (2006.01)
*G01R 29/14* (2006.01)
*H02H 9/04* (2006.01)

(52) U.S. Cl.
CPC .......... *H01L 27/0266* (2013.01); *G01R 29/14* (2013.01); *H02H 9/046* (2013.01)

(58) Field of Classification Search
CPC . H01L 27/0266; H01L 27/0248; G01R 29/14; G01R 31/002; H02H 9/046
See application file for complete search history.

(56) References Cited

U.S. PATENT DOCUMENTS 9,955,581 B2 * 4/2018 Chen ................... H05K 1/0245
2015/0070807 A1 * 3/2015 Baek ..................... H02H 9/046
361/86

* cited by examiner

*Primary Examiner* — Pete T Lee
(74) *Attorney, Agent, or Firm* — Cha & Reiter, LLC.

(57) ABSTRACT

Provided are an electronic device and control method therefor. The electronic device may include: a first electronic component; a second electronic component electrically connected to the first electronic component via a first line, where the second electronic component receives a data signal from the first electronic component via the first line; and a third electronic component electrically connected to the first electronic component via a second line and electrically connected to the second electronic component. At least a portion of the second line is substantially parallel to at least a portion of the first line. The third electronic component is configured to compare an electrical signal received via the second line to a reference signal and determine whether an electrostatic discharge (ESD) has occurred based on the comparison result, and the second electronic component is configured to control the first electronic component based on the determination result. Hence, it is possible to accurately detect ESD occurrence by using a coupling circuit and an electrical signal coupled with an electrical signal generated by ESD.

18 Claims, 28 Drawing Sheets

ELECTRONIC DEVICE AND METHOD FOR OPERATING THE SAME

CLAIM OF PRIORITY

This application claims priority from and the benefit under 35 U.S.C. § 119(a) of Korean Patent Application No. 10-2016-0084773 filed on Jul. 5, 2016, which is hereby incorporated by reference for all purposes as if fully set forth herein.

TECHNICAL FIELD

The present disclosure relates to an electronic device and method for operating the same. More particularly, the present disclosure relates to technology for detecting occurrence of electrostatic discharge (ESD) in modules of an electronic device.

BACKGROUND

Electrostatic discharge (ESD) is the sudden flow of electricity between differently charged objects (i.e. a positively-charged object and a negatively-charged object) in a relatively short period of time. ESD may occur when differently-charged objects are brought into contact or near-contact with each other.

ESD may occur due to static charges that are deposited on the differently-charged objects. As charges transmit in a relatively short period of time, ESD may generate high voltages. These high voltages generated by ESD may damage electronic components.

ESDs may be classified into two types depending on they affect electronic components. First, a chip-level ESD may cause physical damage to components embedded in the electronic device. Second, a system-level ESD may occur during system operation and cause system errors. As ESDs can significantly affect electronic devices, efforts are underway for developing techniques to detect ESD occurrence.

One of existing ESD detection techniques involve ground bouncing. This ground bouncing technique takes advantage of the phenomenon where when ESD occurs in a circuit, the ground value of the circuit changes.

However, existing ESD detection techniques tend to have low accuracy, producing erroneous results. For the ground bouncing technique, it is difficult to build a suitable prediction model.

SUMMARY

Aspects of the present disclosure are to address at least the above mentioned problems and/or disadvantages and to provide at least the advantages described below. Accordingly, an aspect of the present disclosure is to provide an electronic device and method for operating the same that can detect ESD occurrence and rapidly recover the system when an ESD has occurred.

In accordance with an aspect of the present disclosure, there is provided an electronic device. The electronic device may include: a first electronic component; a second electronic component electrically connected to the first electronic component via a first line, where the second electronic component receives a data signal from the first electronic component via the first line; and a third electronic component electrically connected to the first electronic component via a second line and electrically connected to the second electronic component. At least a portion of the second line is substantially parallel to at least a portion of the first line. The third electronic component is configured to compare an electrical signal received via the second line to a reference signal and determine whether an electrostatic discharge (ESD) has occurred based on the comparison result, and the second electronic component is configured to control the first electronic component based on the determination result.

In accordance with another aspect of the present disclosure, there is provided a method for operating an electronic device that includes a first line electrically connecting a first electronic component and a second electronic component, and a second line electrically connecting a third electronic component and the first electronic component and placed such that at least a portion of the second line is substantially parallel to at least a portion of the first line. The method may include: transmitting a data signal via the first line; comparing an electrical signal in the second line with a reference signal; determining, by the third electronic component, whether an electrostatic discharge (ESD) has occurred based on the comparison result; and controlling, by the second electronic component, the first electronic component based on the determination result.

In a feature of the present disclosure, the operation method enables the electronic device to accurately detect whether ESD has occurred by using a coupling circuit and analyzing electrical signals in the coupling circuit.

When an ESD occurs, the operation method may check occurrence of an error in the electronic component where ESD has occurred and reset the component the error is detected.

And in the case where ESD is detected in an electronic component, when corresponding error is detected in, for example, the output of the electronic component, the electronic component may not be reset. Thus, unnecessary resets may be avoided.

DETAILED DESCRIPTION

Figure 1:
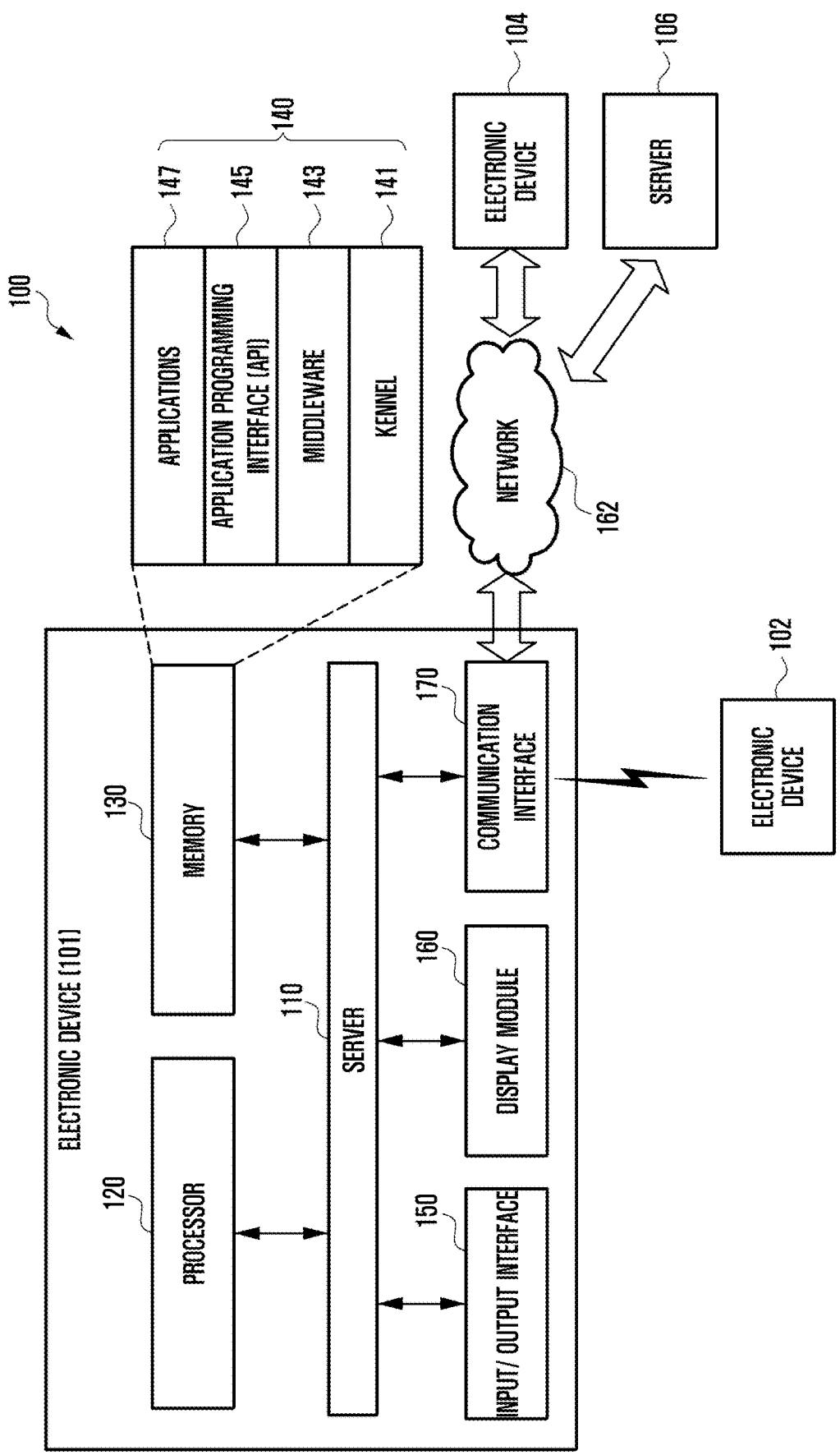
FIG. 1 illustrates a network environment including electronic devices according to one embodiment of the present disclosure.

The following description is made with reference to the accompanying drawings and is provided to assist in a comprehensive understanding of various example embodiments of the present disclosure as defined by the claims and their equivalents. It includes various specific details to assist in that understanding but these are to be regarded as merely examples. Accordingly, those of ordinary skill in the art will recognize that various changes and modifications of the various example embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, may simply be used to enable a clear and consistent understanding of the present disclosure. Accordingly, it should be apparent to those skilled in the art that the following description of various example embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "substantially" may generally denote that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The expressions, such as "include" and "may include" which may be used in the present disclosure may refer, for example, to the presence of the disclosed functions, operations, and constituent elements and do not limit one or more additional functions, operations, and elements. In an example embodiment of the present disclosure, the terms, such as "include" and/or "have" may be understood to refer, for example, to a certain characteristic, number, operation, constituent element, component or a combination thereof, but may not be construed to exclude the existence of or a possibility of addition of one or more other characteristics, numbers, operations, constituent elements, components or combinations thereof.

Furthermore, in the present disclosure, the expression "and/or" includes any and all combinations of the associated listed words. For example, the expression "A and/or B" may include A, may include B, or may include both A and B.

In an example embodiment of the present disclosure, expressions including ordinal numbers, such as "first" and "second," and the like, may modify various elements. However, such elements are not limited by the above expressions. For example, the above expressions do not limit the sequence and/or importance of the elements. The above expressions are used merely for the purpose to distinguish an element from the other elements. For example, a first user device and a second user device indicate different user devices although both of them are user devices. For example, a first element could be termed a second element, and similarly, a second element could be also termed a first element without departing from the scope of the present disclosure.

In the case where a component is referred to as being "connected" or "accessed" to other component, it should be understood that not only the component is directly connected or accessed to the other component, but also there may exist another component between them. Meanwhile, in the case where a component is referred to as being "directly connected" or "directly accessed" to other component, it should be understood that there is no component therebetween.

An electronic device according to the present disclosure may be a device including a communication function. For example, and without limitation, the device may correspond to a combination of at least one of a smartphone, a tablet personal computer (PC), a mobile phone, a video phone, an e-book reader, a desktop PC, a laptop PC, a netbook computer, a personal digital assistant (PDA), a portable multimedia player (PMP), a digital audio player, a mobile medical device, an electronic bracelet, an electronic necklace, an electronic accessory, a camera, a wearable device, an electronic clock, a wrist watch, home appliances (for example, an air-conditioner, vacuum, an oven, a microwave, a washing machine, an air cleaner, and the like), an artificial intelligence robot, a television (TV), a digital versatile disc (DVD) player, an audio device, various medical devices (for example, magnetic resonance angiography (MRA), magnetic resonance imaging (MRI), computed tomography (CT), a scanning machine, a ultrasonic wave device, and the like), a navigation device, a global positioning system (GPS) receiver, an event data recorder (EDR), a flight data recorder (FDR), a set-top box, a TV box (for example, Samsung HomeSync™, Apple TV™, or Google TV™), an electronic dictionary, vehicle infotainment device, an electronic equipment for a ship (for example, navigation equipment for a ship, gyrocompass, and the like), avionics, a security device, electronic clothes, an electronic key, a camcorder, game consoles, a head-mounted display (HMD), a flat panel display device, an electronic frame, an electronic album, furniture or a portion of a building/structure that includes a communication function, an electronic board, an electronic signature receiving device, a projector, or the like. It will be apparent to those skilled in the art that the electronic device according to the present disclosure is not limited to the aforementioned devices.

According to various example embodiments of the present disclosure, cores included in the processor of the electronic device may be in one of various states. In the method for operating the electronic device, when a core is in the online state, power is normally applied to the core and the core is able to normally execute a process.

In the method for operating the electronic device, when a core is in the idle state, power is applied to the core but the core does not execute a process.

In the method for operating the electronic device, when a core is in the power save state, power whose level is lower than that of power applied in the online state is applied to the core and the core does not execute a process.

In the method for operating the electronic device, when a core is in the offline state, power is not applied to the core and the cache associated with the core is emptied of stored data. Hence, when a core is in the offline state, the core is unable to execute a process.

In the method for operating the electronic device, when the processor includes a first core and a second core, hot-unplugging (hot-plug out) may refer to transitioning the first core from the online state to the offline state. When the processor includes a first core and a second core, hot-plugging (hot-plug in) may refer to transitioning the first core from the offline state to the online state.

In the method for operating the electronic device, a restriction signal may refer to a command signal causing a core to transition into the power save state so as to place restrictions on the usage of the processor.

In the method for operating the electronic device, a restriction lift signal may refer to a command signal for lifting restrictions on the usage of the processor. That is, the restriction lift signal may cause a core to transition into the online state.

FIG. 1 is a block diagram illustrating example electronic devices in a network environment 100 according to one embodiment of the present disclosure.

Referring to FIG. 1, an electronic device 101 may include a bus 110, a processor (e.g., including processing circuitry) 120, a memory 130, an input/output interface (e.g., including interface circuitry) 150, a display 160, a communication interface (e.g., including communication circuitry) 170, and other similar and/or suitable components.

The bus 110 may be a circuit which interconnects the above-described elements and delivers a communication (e.g., a control message) between the above-described elements.

The processor 120 may include various processing circuitry and receive commands from the above-described other elements (e.g., the memory 130, the input/output interface 150, the display 160, the communication 170, and the like) through the bus 110, may interpret the received commands, and may execute calculation or data processing according to the interpreted commands. Although illustrated as one element, the processor 120 may include multiple processors without departing from the teachings herein. The processor 120 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Any of the functions and steps provided in the figures may be implemented in hardware, software or a combination of both and may be performed in whole or in part within the programmed instructions of a computer. No claim element herein is to be construed under the provisions of 35 U.S.C. 112, sixth paragraph, unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

The memory 130 may store commands or data received from the processor 120 or other elements (e.g., the input/output interface 150, the display 160, the communication interface 170, and the like) or generated by the processor 120 or the other elements. The memory 130 may include programming modules 140, such as a kernel 141, middleware 143, an application programming interface (API) 145, an application 147, and the like. Each of the above-described programming modules may be implemented in software, firmware, hardware, or a combination of two or more thereof.

The kernel 141 may control or manage system resources (e.g., the bus 110, the processor 120, the memory 130, and the like) used to execute operations or functions implemented by other programming modules (e.g., the middleware 143, the API 145, and the application 147). In addition, the kernel 141 may provide an interface capable of accessing and controlling or managing the individual elements of the electronic device 101 by using the middleware 143, the API 145, or the application 147.

The middleware 143 may serve to go between the API 145 or the application 147 and the kernel 141 in such a manner that the API 145 or the application 147 communicates with the kernel 141 and exchanges data therewith. In addition, in relation to work requests received from one or more applications 147 and/or the middleware 143, for example, may perform load balancing of the work requests by using a method of assigning a priority, in which system resources (e.g., the bus 110, the processor 120, the memory 130, and the like) of the electronic device 101 can be used, to at least one of the one or more applications 147.

The API 145 is an interface through which the application 147 is capable of controlling a function provided by the kernel 141 or the middleware 143, and may include, for example, at least one interface or function for file control, window control, image processing, character control, and the like.

The input/output interface 150 may include various interface circuitry and, for example, may receive a command or data as input from a user, and may deliver the received command or data to the processor 120 or the memory 130 through the bus 110. The display 160 may display a video, an image, data, and the like, to the user.

The communication interface 170 may include various communication circuitry and connect communication between electronic devices 102 and 104 and the electronic device 101. The communication interface 170 may support a short-range communication protocol (e.g., Wi-Fi, Bluetooth (BT), and near field communication (NFC)), or a network communication (e.g., the internet, a local area network (LAN), a wide area network (WAN), a telecommunication network, a cellular network, a satellite network, a plain old telephone service (POTS), and the like). Each of the electronic devices 102 and 104 may be a device which is identical (e.g., of an identical type) to or different (e.g., of a different type) from the electronic device 101. Further, the communication interface 170 may connect communication between a server 106 and the electronic device 101 via the network 162.

Figure 2:
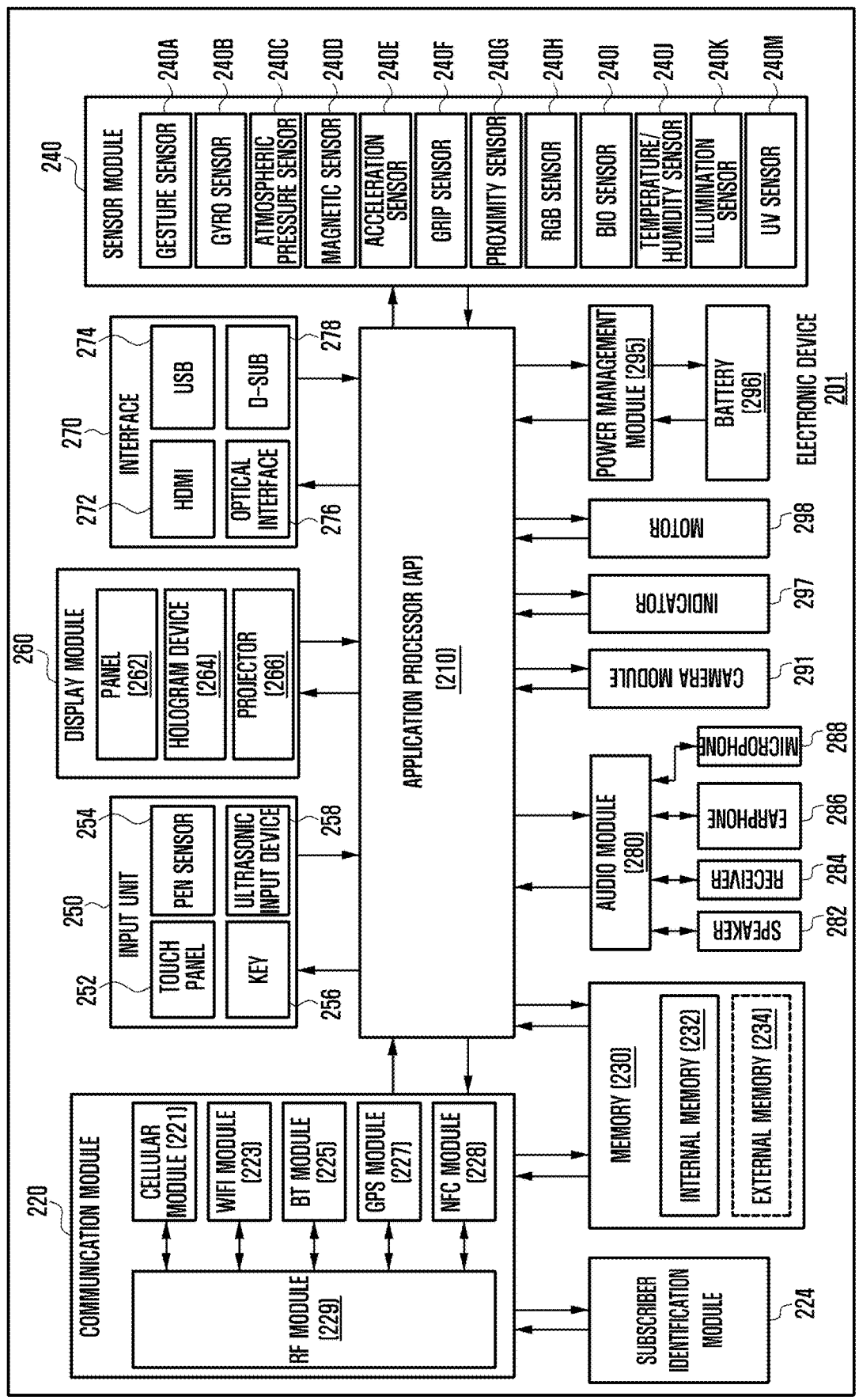
FIG. 2 is a block diagram of an electronic device according to one embodiment of the present disclosure.

FIG. 2 is a block diagram illustrating an example electronic device according to one example embodiment of the present disclosure.

Referring to FIG. 2, an electronic device 201 may be, for example, the electronic device 101 illustrated in FIG. 1.

Referring to FIG. 2, the electronic device 201 may include a processor (e.g., and application processor including processing circuitry) 210, a subscriber identification module (SIM) card 224, a memory 230, a communication module (e.g., including communication circuitry) 220, a sensor module 240, an input device (e.g., including input circuitry) 250, a display 260, an interface (e.g., including interface circuitry) 270, an audio module (coder/decoder (codec)) 280, a camera module 291, a power management module 295, a battery 296, an indicator 297, a motor 298 and any other similar and/or suitable components.

The processor 210 may include various processing circuitry, such as, for example, and without limitation, one or more of a dedicated processor, a CPU, application processors (APs) (not illustrated), or one or more communication processors (CPs) (not illustrated). The processor 210 may be, for example, the processor 120 illustrated in FIG. 1. The AP and the CP may be included in the processor 210 in FIG. 2, or may be included in different integrated circuit (IC) packages, respectively. According to an embodiment of the present disclosure, the AP and the CP may be included in one IC package.

The AP may execute an operating system (OS) or an application program, and thereby may control multiple hardware or software elements connected to the AP and may perform data processing of and arithmetic operations on various data including multimedia data. The AP may be implemented by, for example, a system on chip (SoC). According to an embodiment of the present disclosure, the processor 210 may further include a graphical processing unit (GPU) (not illustrated).

The CP may manage a data line and may convert a communication protocol in the case of communication between the electronic device (e.g., the electronic device 101) including the electronic device 201 and different electronic devices connected to the electronic device through the network. The CP may be implemented by, for example, an SoC. According to an embodiment of the present disclosure, the CP may perform at least some of multimedia control functions. The CP, for example, may distinguish and authenticate a terminal in a communication network by using a SIM (e.g., the SIM card 224). In addition, the CP may provide the user with services, such as a voice telephony call, a video telephony call, a text message, packet data, and the like.

Further, the CP may control the transmission and reception of data by the communication module 220. In FIG. 2, the elements, such as the power management module 295, the memory 230, and the like are illustrated as elements separate from the processor 210. However, according to an embodiment of the present disclosure, the processor 210 may include at least some of the above-described elements (e.g., the power management module 295).

According to an example embodiment of the present disclosure, the AP or the CP may load, to a volatile memory, a command or data received from at least one of a non-volatile memory and other elements connected to each of the AP and the CP, and may process the loaded command or data. In addition, the AP or the CP may store, in a non-volatile memory, data received from or generated by at least one of the other elements.

The SIM card 224 may be a card implementing a SIM, and may be inserted into a slot formed in a particular portion of the electronic device 201. The SIM card 224 may include unique identification information (e.g., IC card identifier (ICCID)) or subscriber information (e.g., international mobile subscriber identity (IMSI)).

The memory 230 may include an internal memory 232 and/or an external memory 234. The memory 230 may be, for example, the memory 130 illustrated in FIG. 1. The internal memory 232 may include, for example, at least one of a volatile memory (e.g., a dynamic random access memory (DRAM), a static RAM (SRAM), a synchronous dynamic RAM (SDRAM), and the like), and a non-volatile memory (e.g., a one time programmable read only memory (OTPROM), a programmable ROM (PROM), an erasable and programmable ROM (EPROM), an electrically erasable and programmable ROM (EEPROM), a mask ROM, a flash ROM, a not AND (NAND) flash memory, a not OR (NOR) flash memory, and the like). According to an embodiment of the present disclosure, the internal memory 232 may be in the form of a solid state drive (SSD). The external memory 234 may further include a flash drive, for example, a compact flash (CF), a secure digital (SD), a micro-SD, a mini-SD, an extreme digital (xD), a memory stick, and the like.

The communication module 220 may include various communication circuitry including, for example, and without limitation, a radio frequency (RF) module 229. The communication module 220 may be, for example, the communication interface 170 illustrated in FIG. 1. The communication module 220 may further include various communication circuitry including, for example, and without limitation, wireless communication modules to enable wireless communication through the RF module 229. The wireless communication modules may include, for example, and without limitation, a cellular module 221, a Wi-Fi module 223, a BT module 225, a GPS module 227, and/or a NFC module 228. Additionally or alternatively, the wireless communication modules may further include a network interface (e.g., a LAN card), a modulator/demodulator (modem), and the like for connecting the electronic device 201 to a network (e.g., the internet, a LAN, a WAN, a telecommunication network, a cellular network, a satellite network, a POTS, and the like) (not illustrated).

The communication module 220 (e.g., the communication interface 170) may perform data communication with other electronic devices (e.g., the electronic devices 102 and 104, and the server 106) through a network (e.g., network 162).

The RF module 229 may be used for transmission and reception of data, for example, transmission and reception of RF signals or called electronic signals. Although not illustrated, the RF unit 229 may include, for example, a transceiver, a power amplifier module (PAM), a frequency filter, a low noise amplifier (LNA), and the like. In addition, the RF module 229 may further include a component for transmitting and receiving electromagnetic waves in a free space in a wireless communication, for example, a conductor, a conductive wire, and the like.

The sensor module 240 may include, for example, at least one of a gesture sensor 240A, a gyro sensor 240B, an atmospheric pressure (e.g., barometer) sensor 240C, a magnetic sensor 240D, an acceleration sensor 240E, a grip sensor 240F, a proximity sensor 240G, a red, green and blue (RGB) sensor 240H, a biometric sensor 240I, a temperature/humidity sensor 240J, an illuminance (e.g., light) sensor 240K, and an ultra violet (UV) sensor 240M. The sensor module 240 may measure a physical quantity or may detect an operating state of the electronic device 201, and may convert the measured or detected information to an electrical signal. Additionally/alternatively, the sensor module 240 may include, for example, an electronic nose (E-nose) sensor (not illustrated), an electromyography (EMG) sensor (not illustrated), an electroencephalogram (EEG) sensor (not illustrated), an electrocardiogram (ECG) sensor (not illustrated), a fingerprint sensor (not illustrated), and the like. Additionally or alternatively, the sensor module 240 may include, for example, an E-nose sensor (not illustrated), an EMG sensor (not illustrated), an EEG sensor (not illustrated), an ECG sensor (not illustrated), a fingerprint sensor, and the like. The sensor module 240 may further include a control circuit (not illustrated) for controlling one or more sensors included therein. The sensor module 240 may also, or in the alternative, be controlled by the processor 210.

The input device 250 may include various input circuitry, such as, for example, and without limitation, a touch panel 252, a pen sensor 254 (e.g., a digital pen sensor), keys 256, and an ultrasonic input device 258. The input device 250 may be, for example, the input/output interface 150 illustrated in FIG. 1. The touch panel 252 may recognize a touch input in at least one of, for example, a capacitive scheme, a resistive scheme, an infrared scheme, and an acoustic wave scheme. In addition, the touch panel 252 may further include a controller (not illustrated). In the capacitive type, the touch panel 252 is capable of recognizing proximity as well as a direct touch. The touch panel 252 may further include a tactile layer (not illustrated). In this event, the touch panel 252 may provide a tactile response to the user.

The pen sensor 254 (e.g., a digital pen sensor), for example, may be implemented by using a method identical or similar to a method of receiving a touch input from the user, or by using a separate sheet for recognition. For example, a key pad or a touch key may be used as the keys 256. The ultrasonic input device 258 enables the terminal to detect a sound wave by using a microphone (e.g., a microphone 288) of the terminal through a pen generating an ultrasonic signal, and to identify data. The ultrasonic input device 258 is capable of wireless recognition. According to an embodiment of the present disclosure, the electronic device 201 may receive a user input from an external device (e.g., a network, a computer, or a server), which is connected to the electronic device 201, through the communication module 220.

The display 260 may include a panel 262, a hologram 264, and a projector 266. The display 260 may be, for example, the display 160 illustrated in FIG. 1. The panel 262 may be, for example, a liquid crystal display (LCD) and an active matrix organic light emitting diode (AM-OLED) display, or the like, but is not limited thereto. The panel 262 may be implemented so as to be, for example, flexible, transparent, or wearable. The panel 262 may include the touch panel 252 and one module. The hologram 264 may display a three-dimensional image in the air by using interference of light. The projector 266 may include light-projecting elements, such as LEDs, to project light into external surfaces. According to an embodiment of the present disclosure, the display 260 may further include a control circuit for controlling the panel 262, the hologram 264, or the projector 266.

The interface 270 may include various interface circuitry, such as, for example, and without limitation, a high-definition multimedia interface (HDMI) 272, a universal serial bus (USB) 274, an optical interface 276, and a d-subminiature (D-sub) 278. Additionally or alternatively, the interface 270 may include, for example, SD/multi-media card (MMC) (not illustrated) or infrared data association (IrDA) (not illustrated).

The audio module (codec) 280 may bidirectionally convert between a voice and an electrical signal. The audio module 280 may convert voice information, which is input to or output from the audio module 280, through, for example, a speaker 282, a receiver 284, an earphone 286, the microphone 288, and the like.

The camera module 291 may capture an image and a moving image. According to an embodiment of the present disclosure, the camera module 291 may include one or more image sensors (e.g., a front lens or a back lens), an image signal processor (ISP) (not illustrated), and a flash LED (not illustrated).

The power management module 295 may manage power of the electronic device 201. Although not illustrated, the power management module 295 may include, for example, a power management IC (PMIC), a charger IC, or a battery fuel gauge.

The PMIC may be mounted to, for example, an IC or an SoC semiconductor. Charging methods may be classified into a wired charging method and a wireless charging method. The charger IC may charge a battery, and may prevent an overvoltage or an overcurrent from a charger to the battery. According to an embodiment of the present disclosure, the charger IC may include a charger IC for at least one of the wired charging method and the wireless charging method. Examples of the wireless charging method may include a magnetic resonance method, a magnetic induction method, an electromagnetic method, and the like. Additional circuits (e.g., a coil loop, a resonance circuit, a rectifier, and the like) for wireless charging may be added in order to perform the wireless charging.

The battery fuel gauge may measure, for example, a residual quantity of the battery 296, or a voltage, a current or a temperature during the charging. The battery 296 may supply power by generating electricity, and may be, for example, a rechargeable battery.

The indicator 297 may indicate particular states of the electronic device 201 or a part of the electronic device 201 (e.g., the AP), for example, a booting state, a message state, a charging state and the like. The motor 298 may convert an electrical signal into a mechanical vibration.

Although not illustrated, the electronic device 201 may include a processing unit (e.g., a GPU) for supporting a module TV. The processing unit for supporting a module TV may process media data according to standards, such as, for example, digital multimedia broadcasting (DMB), digital video broadcasting (DVB), media flow, and the like. Each of the above-described elements of the electronic device 201 according to an embodiment of the present disclosure may include one or more components, and the name of the relevant element may change depending on the type of electronic device. The electronic device 201 according to an embodiment of the present disclosure may include at least one of the above-described elements. Some of the above-described elements may be omitted from the electronic device 201, or electronic device 201 may further include additional elements. In addition, some of the elements of the electronic device 201 according to an embodiment of the present disclosure may be combined into one entity, which may perform functions identical to those of the relevant elements before the combination.

The term "module" used in the present disclosure may refer to, for example, a unit including one or more combinations of hardware, software, and firmware. The "module" may be interchangeable with a term, such as "unit," "logic," "logical block," "component," "circuit," and the like. The "module" may be a minimum unit of a component formed as one body or a part thereof. The "module" may be a minimum unit for performing one or more functions or a part thereof. The "module" may be implemented mechanically or electronically. For example, the "module" according to an example embodiment of the present disclosure may include at least one of a dedicated processor, a CPU, an application-specific integrated circuit (ASIC) chip, a field-programmable gate array (FPGA), and a programmable-logic device for performing certain operations which have been known or are to be developed in the future.

Figure 3:
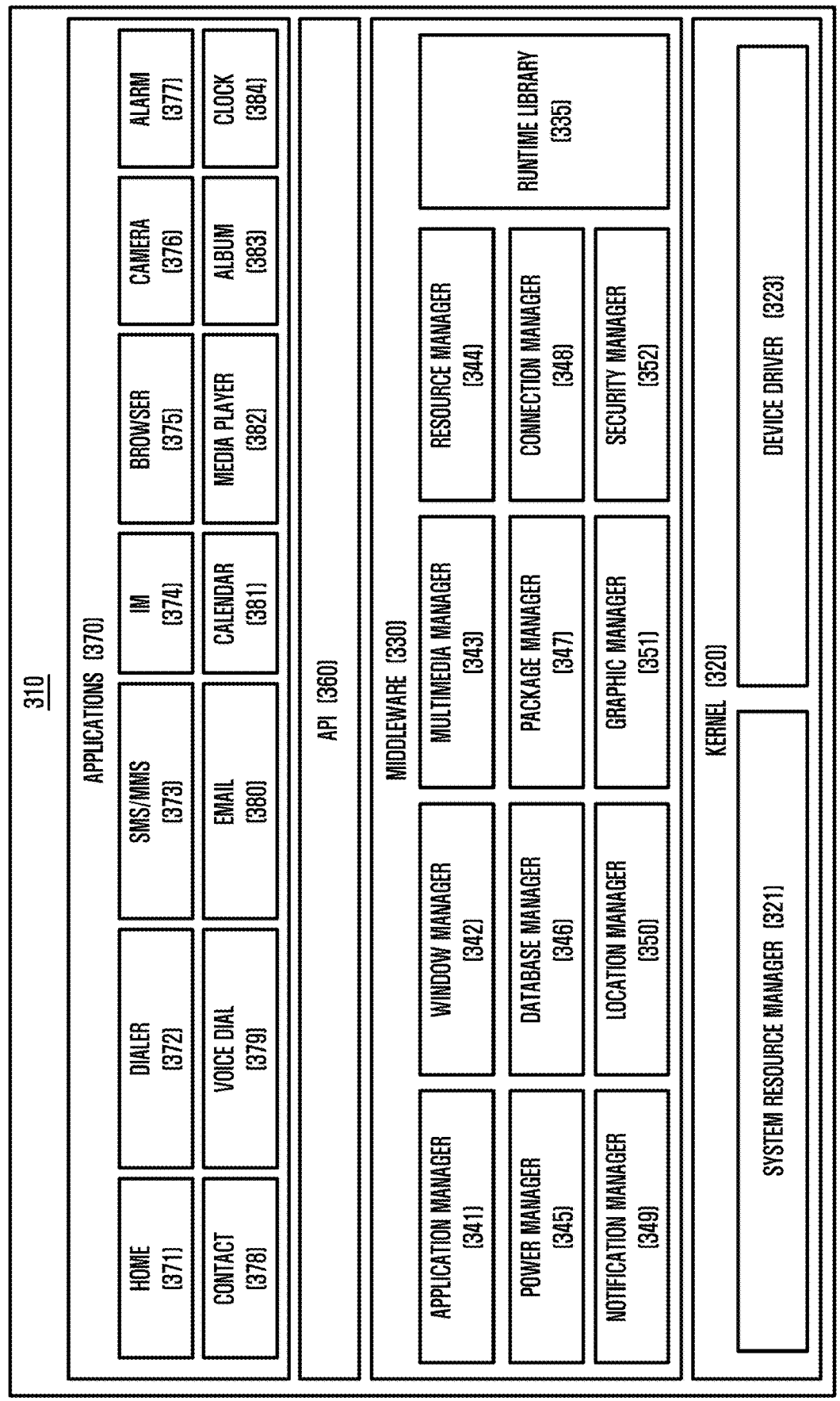
FIG. 3 is a block diagram of a program module according to one embodiment of the present disclosure.

FIG. 3 is a block diagram illustrating an example configuration of a programming module according to an example embodiment of the present disclosure.

Referring to FIG. 3, a programming module 300 may be included (or stored) in the electronic device 101 (e.g., the memory 130) or may be included (or stored) in the electronic device 201 (e.g., the memory 230) illustrated in FIG. 1. At least a part of the programming module 300 may be implemented in software, firmware, hardware, or a combination of two or more thereof. The programming module 300 may be implemented in hardware (e.g., the electronic device 201), and may include an OS controlling resources related to an electronic device (e.g., the electronic device 101) and/or various applications (e.g., an application 370) executed in the OS. For example, the OS may be Android, iOS, Windows, Symbian, Tizen, Bada, and the like.

Referring to FIG. 3, the programming module 300 may include a kernel 320, a middleware 330, an API 360, and/or the application 370.

The kernel 320 (e.g., the kernel 141) may include a system resource manager 321 and/or a device driver 323. The system resource manager 321 may include, for example, a process manager (not illustrated), a memory manager (not illustrated), and a file system manager (not illustrated). The system resource manager 321 may perform the control, allocation, recovery, and the like of system resources. The device driver 323 may include, for example, a display driver (not illustrated), a camera driver (not illustrated), a BT driver (not illustrated), a shared memory driver (not illustrated), a USB driver (not illustrated), a keypad driver (not illustrated), a Wi-Fi driver (not illustrated), and/or an audio driver (not illustrated). In addition, according to an embodiment of the present disclosure, the device driver 323 may include an inter-process communication (IPC) driver (not illustrated).

The middleware 330 may include multiple modules previously implemented so as to provide a function used in common by the applications 370. In addition, the middleware 330 may provide a function to the applications 370 through the API 360 in order to enable the applications 370 to efficiently use limited system resources within the electronic device. For example, as illustrated in FIG. 3, the middleware 330 (e.g., the middleware 143) may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, a security manager 352, and any other suitable and/or similar manager.

The runtime library 335 may include, for example, a library module used by a complier, in order to add a new function by using a programming language during the execution of the application 370. According to an embodiment of the present disclosure, the runtime library 335 may perform functions which are related to input and output, the management of a memory, an arithmetic function, and the like.

The application manager 341 may manage, for example, a life cycle of at least one of the applications 370. The window manager 342 may manage graphical user interface (GUI) resources used on the screen. The multimedia manager 343 may detect a format used to reproduce various media files and may encode or decode a media file through a codec appropriate for the relevant format. The resource manager 344 may manage resources, such as a source code, a memory, a storage space, and the like of at least one of the applications 370.

The power manager 345 may operate together with a basic input/output system (BIOS), may manage a battery or power, and may provide power information and the like used for an operation. The database manager 346 may manage a database in such a manner as to enable the generation, search and/or change of the database to be used by at least one of the applications 370. The package manager 347 may manage the installation and/or update of an application distributed in the form of a package file.

The connectivity manager 348 may manage a wireless connectivity, such as, for example, Wi-Fi and BT. The notification manager 349 may display or report, to the user, an event, such as an arrival message, an appointment, a proximity alarm, and the like in such a manner as not to disturb the user. The location manager 350 may manage location information of the electronic device. The graphic manager 351 may manage a graphic effect, which is to be provided to the user, and/or a user interface related to the graphic effect. The security manager 352 may provide various security functions used for system security, user authentication, and the like. According to an embodiment of the present disclosure, when the electronic device (e.g., the electronic device 101) has a telephone function, the middleware 330 may further include a telephony manager (not illustrated) for managing a voice telephony call function and/or a video telephony call function of the electronic device.

The middleware 330 may generate and use a new middleware module through various functional combinations of the above-described internal element modules. The middleware 330 may provide modules specialized according to types of OSs in order to provide differentiated functions. In addition, the middleware 330 may dynamically delete some of the existing elements, or may add new elements. Accordingly, the middleware 330 may omit some of the elements described in the various embodiments of the present disclosure, may further include other elements, or may replace the some of the elements with elements, each of which performs a similar function and has a different name.

The API 360 (e.g., the API 145) is a set of API programming functions, and may be provided with a different configuration according to an OS. In the case of Android or iOS, for example, one API set may be provided to each platform. In the case of Tizen, for example, two or more API sets may be provided to each platform.

The applications 370 (e.g., the applications 147) may include, for example, a preloaded application and/or a third party application. The applications 370 may include, for example, a home application 371, a dialer application 372, a short message service (SMS)/multimedia message service (MMS) application 373, an instant message (IM) application 374, a browser application 375, a camera application 376, an alarm application 377, a contact application 378, a voice dial application 379, an electronic mail (e-mail) application 380, a calendar application 381, a media player application 382, an album application 383, a clock application 384, and any other suitable and/or similar application.

At least a part of the programming module 300 may be implemented by instructions stored in a non-transitory computer-readable storage medium. When the instructions are executed by one or more processors (e.g., the processor 210), the one or more processors may perform functions corresponding to the instructions. The non-transitory computer-readable storage medium may be, for example, the memory 230. At least a part of the programming module 300 may be implemented (e.g., executed) by, for example, the processor 210. At least a part of the programming module 300 may include, for example, a module, a program, a routine, a set of instructions, and/or a process for performing one or more functions.

Names of the elements of the programming module (e.g., the programming module 300) according to an embodiment of the present disclosure may change depending on the type of OS. The programming module according to an embodiment of the present disclosure may include one or more of the above-described elements. Alternatively, some of the above-described elements may be omitted from the programming module. Alternatively, the programming module may further include additional elements. The operations performed by the programming module or other elements according to an embodiment of the present disclosure may be processed in a sequential method, a parallel method, a repetitive method, or a heuristic method. In addition, some of the operations may be omitted, or other operations may be added to the operations.

Figure 4:
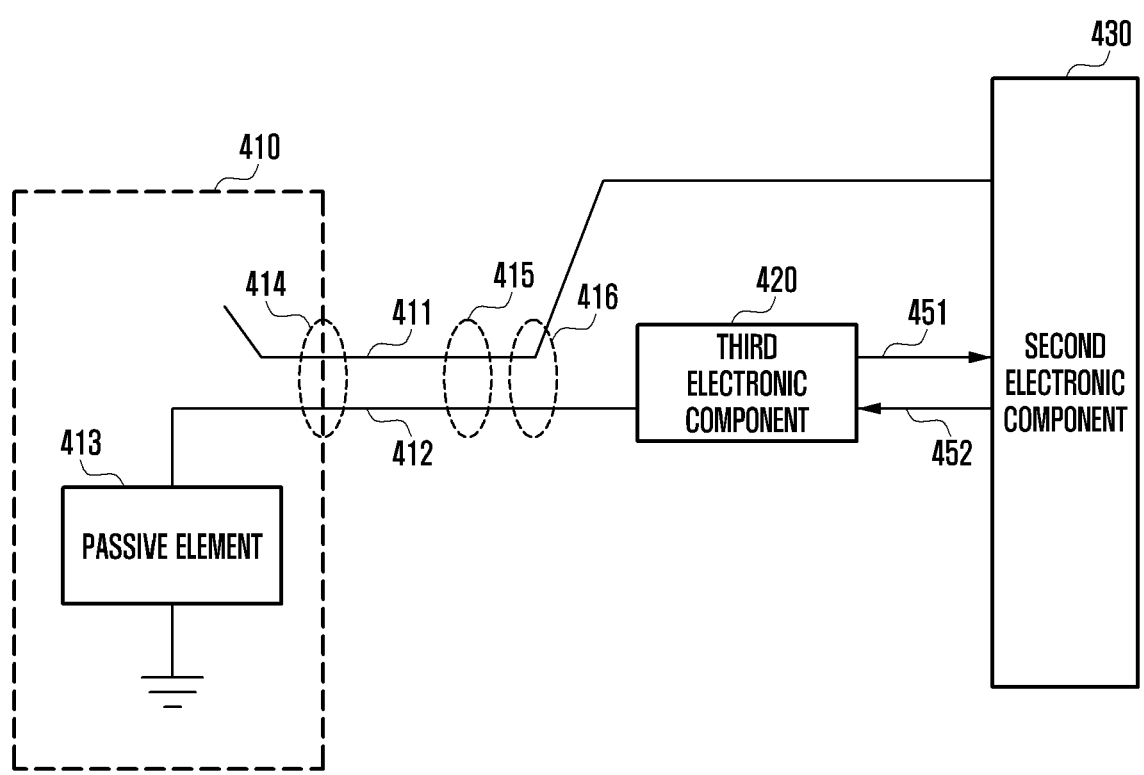
FIG. 4 is a block diagram of an electronic device according to one embodiment of the present disclosure.

FIG. 4 is a block diagram of an electronic device according to one embodiment of the present disclosure.

Referring to FIG. 4, the electronic device of the present disclosure may include a first electronic component 410, a third electronic component 420, and a second electronic component 430.

The second electronic component 430 may be electrically connected to the first electronic component 410, and may receive a data signal from the first electronic component 410 via a first line 411 and process the received data signal.

In one embodiment, the second electronic component 430 may be implemented as an integrated circuit (IC). The second electronic component 430 may include at least one of an active element and a passive element, and may be implemented as one or more modules.

The first electronic component 410 may be various components installed in the electronic device. For example, the first electronic component 410 may be one of various modules installable in the electronic device, such as a GPS sensor module, infrared sensor module, camera module, and display driver integrated circuit (IC). A data signal generated by the first electronic component 410 may be sent to the second electronic component 430, which may then process the received data signal.

For example, when the first electronic component 410 is a camera module, the data signal may be an image signal generated by the camera module capturing images. The second electronic component 430 may process the data signal into still images or moving images, and store the still images or moving images in a separate storage space or output the same to the display.

As another example, when the first electronic component 410 is a display driver, the data signal may be display status information. The second electronic component 430 may process the data signal to identify the display state. For instance, the second electronic component 430 may determine whether an error has occurred in the display according to the processing result of the data signal.

The third electronic component 420 may be a circuit electrically connected to the first electronic component 410 and the second electronic component 430.

The third electronic component 420 may receive an electrical signal transmitted through the second line 412 and may compare the received signal with a preset reference signal. The third electronic component 420 may detect ESD on the basis of the comparison result and notify the second electronic component 430 of the detection result.

The second line 412 may be disposed within a present distance from the first line 411.

The second line 412 may be arranged substantially in parallel with the first line 411 within a present distance therefrom. A segment of the second line 412 may be arranged substantially in parallel with a segment of the first line 411. The second line 412 may be substantially in parallel with the first line 411 when there is coupling between the first line 411 and the second line 412 such that an electrical signal flowing through the first line 411 may generate a corresponding signal in the second line 412 due to the coupling.

In one embodiment, the second line 412 and the first line 411 may be transmission lines (i.e. traces) of a Flexible Printed Circuit Board (FPCB) of the first electronic component 410.

In one embodiment, the second line 412 may be electrically connected to a passive element 413 disposed in the first electronic component 410. The passive element 413 may be omitted according to the circuit design. In another embodiment, the passive element 413 may not be disposed in the first electronic component 410 and may rather be a stand-alone component.

The second electronic component 430 may control the first electronic component 410 on the basis of whether ESD has occurred.

When ESD occurs in the first electronic component 410, an electrical signal having a voltage higher than that of the regular data signal may be sent through the first line 411 to the second electronic component 430.

The second line 412 may be arranged close (i.e. within a preset distance) to the first line 411. The electrical signal flowing through the first line 411 may generate an electrical signal in the second line 412, due to coupling between the first line 411 and the second line 412. Examples for arrangement of the second line 412 are described later with reference to FIGS. 5A and 5F.

In particular, the second line 412 may be connected to the passive element 413. The passive element 413 may cause a voltage drop at the electrical signal flowing through the second line 412. In turn, the voltage value of the electrical signal in the second line 412 may be detected by the third electronic component 420. Then, the third electronic component 420 may compare the voltage value of the electrical signal with that of the reference signal and determine whether ESD has occurred on the basis of the comparison result.

The passive element 413 may include at least one of a resister, an inductor, and a capacitor. The passive element 413 may be disposed inside the first electronic component 410, or be a standalone component of the electronic device. More specifically, the passive element 413 may be mounted on the flexible printed circuit board (FPCB) of the first electronic component 410 and may be connected to the third electronic component 420 via the second line 412. The passive element 413 may be arranged differently or be omitted depending on the circuit design.

Components for the third electronic component 420 are described later with reference to FIG. 6.

If the voltage value of the electrical signal sent through the second line 412 is greater than that of the reference signal, the third electronic component 420 may determine that ESD has occurred inside the first electronic component 410. If the voltage value of the electrical signal sent through the second line 412 is not greater than that of the reference signal, the third electronic component 420 may determine that ESD has not occurred inside the first electronic component 410.

Coupling between the first line 411 and the second line 412 may be not necessarily caused by ESD. For example, the electrical signal in the second line 412 may be generated by the data signal sent through the first line 411 when there is coupling between the first line 411 and the second line 412. As another example, the electrical signal in the second line 412 may be generated by coupling with noise transmitted through the first line 411. Hence, the third electronic component 420 may compare the voltage value of the electrical signal transmitted through the second line 412 with that of the reference signal and determine whether ESD has occurred.

In one embodiment, the ESD detection result may be sent to the second electronic component 430 as an interrupt signal.

Upon determining that an ESD has occurred, the second electronic component 430 may determine whether an error has occurred in the first electronic component 410. Occurrence of ESD in the first electronic component 410 does not necessarily cause the first electronic component 410 to malfunction. The second electronic component 430 may analyze the data signal sent through the first line 411 and determine whether an error has occurred in the first electronic component 410 based on the analysis.

The second electronic component 430 may analyze the data signal in various ways. For example, when the first electronic component 410 is a display driver IC, a flag indicating error occurrence may be contained in the header part of the data signal sent by the first electronic component 410. In this case, the flag may be set to one value if an error has occurred and may be set to another value if no error has occurred. The second electronic component 430 may extract the flag value from the header part of the data signal and determine whether an error has occurred in the first electronic component 410 according to the flag value.

When an error has occurred in the first electronic component 410, the second electronic component 430 may cause the first electronic component 410 to be reset. Under the control of the second electronic component 430, the first electronic component 410 may perform the reset operation and then return to normal operation.

Although the third electronic component 420 is depicted as a separate entity different from the first electronic component 410 or the second electronic component 430 in FIG. 4, in other embodiments, the third electronic component 420 may be included in the first electronic component 410 or the second electronic component 430. This is described later with reference to FIGS. 9A to 10B.

FIGS. 5A to 5H illustrate circuits of the electronic device and voltage changes due to coupling effects according to one or more embodiments of the present disclosure.

As shown in FIG. 4, in the space between the first line 411 and the second line 412, indicia 414 indicates the near-end region near the first electronic component 410, indicia 415 indicates the coupling region, and indicia 416 indicates the far-end region near the third electronic component 420.

Figure 5A:
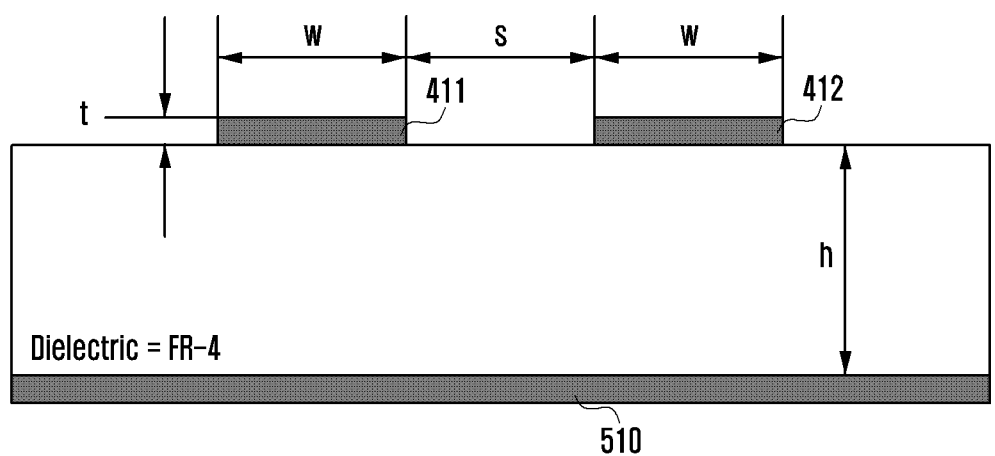
FIG. 5A, FIG. 5B, FIG. 5C, FIG. 5D, FIG. 5E, FIG. 5F, FIG. 5G and FIG. 5H illustrate circuits of the electronic device and voltage changes due to coupling effects according to one or more embodiments of the present disclosure.
Figure 5B:
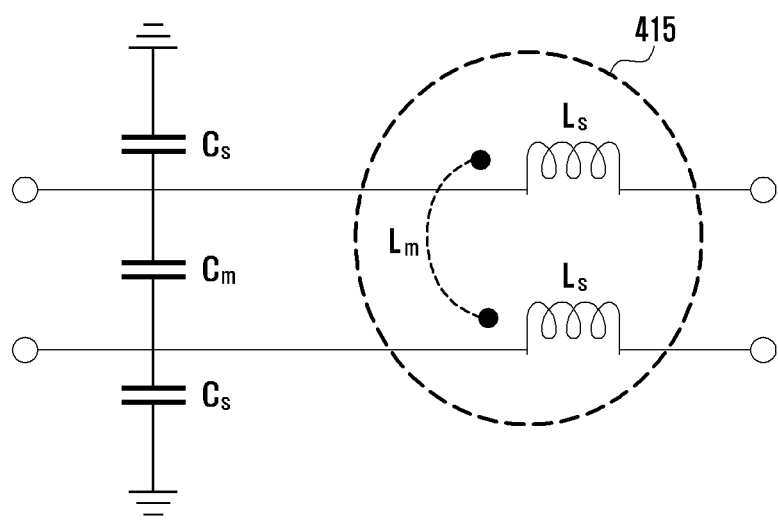

FIG. 5A shows the first line 411, the second line 412, and the substrate 510 of the electronic device, and FIG. 5B illustrates the components of FIG. 5A as circuit symbols.

FIG. 5B shows the capacitance between the first line 411 and the second line 412 ($C_m$), the capacitance between the first line 411 and the substrate 510 ($C_s$), and the capacitance between the second line 412 and the substrate 510 ($C_s$).

In addition, FIG. 5B shows the self-inductance of the first line 411 ($L_s$), the self-inductance of the second line 412 ($L_s$), and the mutual inductance between the first line 411 and the second line 412 ($L_m$) occurring in the coupling region 415.

Figure 5C:
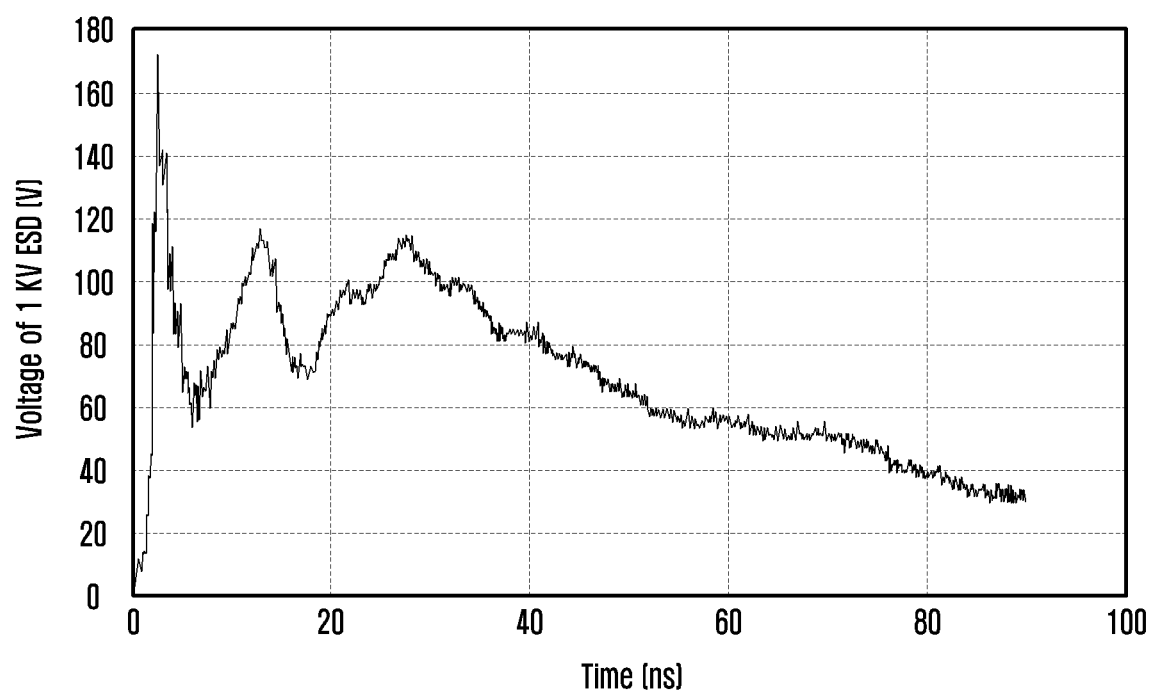
Figure 5D:
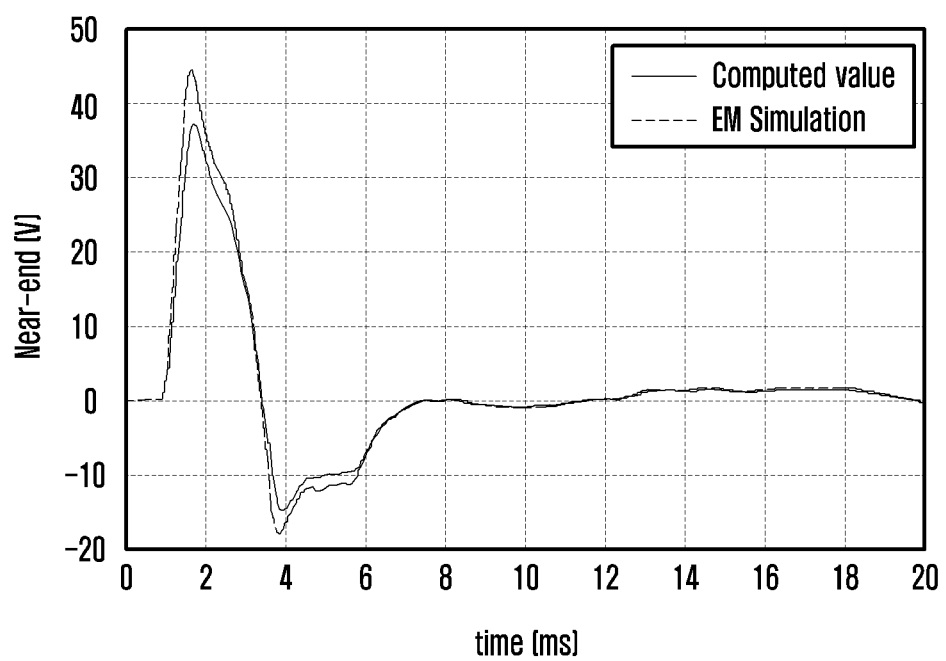
Figure 5E:
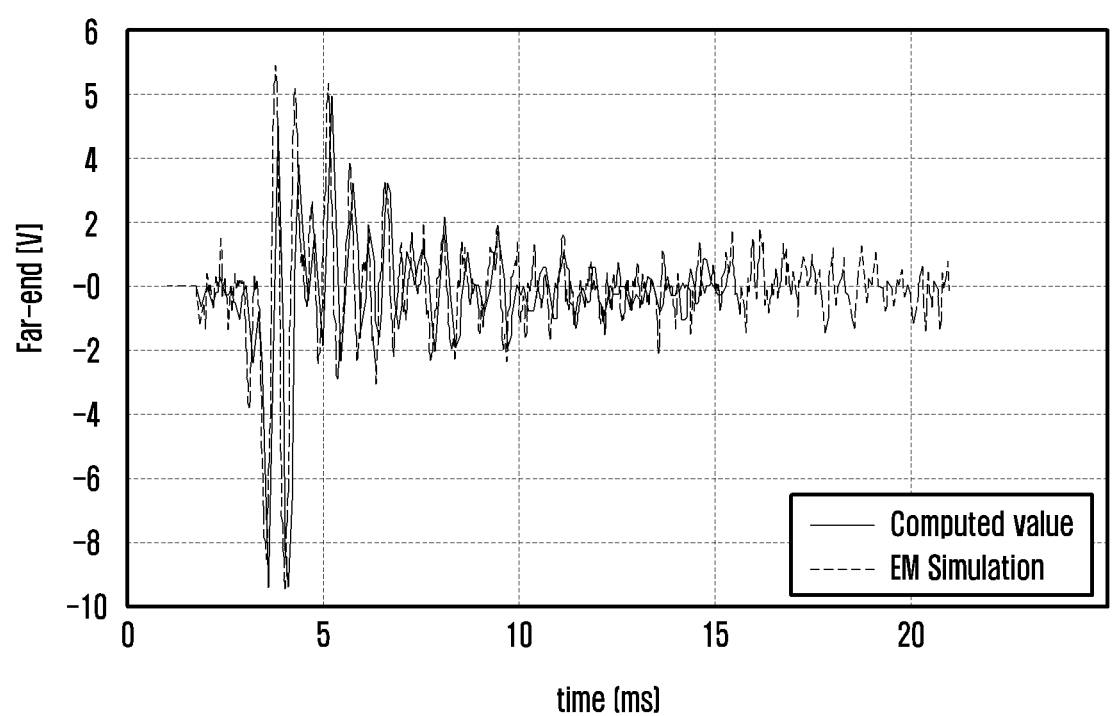

FIGS. 5C to 5E depicts the electrical signal in the second line 412 that is caused by coupling (crosstalk) between the first line 411 carrying the electrical signal caused by ESD and the second line 412.

FIG. 5C shows a graph of a measured electrical signal when a voltage of 1 Kv is applied as ESD to the first line 411.

FIG. 5D shows an electrical signal in the second line 412 at the near-end 414 in response to the electrical signal shown in FIG. 5C, and FIG. 5E shows an electrical signal in the second line 412 at the far-end 416 in response to the electrical signal shown in FIG. 5C. The magnitude of the voltage of the electrical signal shown in FIG. 5D or FIG. 5E may vary according to the spacing (s) between the first line 411 and the second line 412, the line length, etc.

It can be seen from FIG. 5D that, upon ESD occurrence, the voltage at the near-end 414 near the first electronic component 410 rises up to 40V, gradually falls to a value in the opposite phase, and finally has a steady-state value of 0V.

It can be seen from FIG. 5E that the voltage measured at the far-end 416 near the third electronic component 420 has a phase opposite to that of the voltage measured at the near-end 414 near the first electronic component 410. Also, it can be seen that the voltage measured at the far-end 416 has a magnitude less than that of the voltage measured at the near-end 414 due to resistance of the second line 412 itself, which causes voltage drops.

Figure 5F:
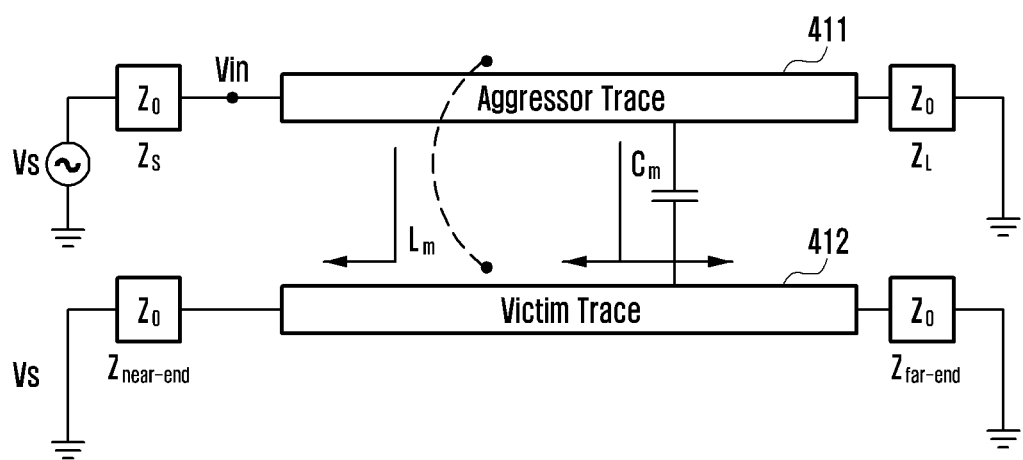

FIG. 5F shows an equivalent circuit for the first line 411 and the second line 412.

Referring to FIG. 5F, the voltage of the electrical signal at the near-end 414 may be represented by Equation 1, showing that the voltage of the electrical signal at the near-end is proportional to the sum of the mutual inductance ($L_m$) and the mutual capacitance ($C_m$).

$$V_{near\text{-}end} = \frac{1}{4}\left(\frac{L_m}{L_s} + \frac{C_m}{C_t}\right) \cdot (V_s(t) - V_s(t - 2t_d)) \quad \text{[Equation 1]}$$

(where $L_s$: inductance of the first line 411, $L_m$: mutual inductance between the first line 411 and the second line 412; $t_d$: delay time of the electrical signal)

The voltage of the electrical signal at the far-end 416 may be represented by Equation 2, showing that the voltage of the electrical signal at the near-end is proportional to the difference between the mutual inductance ($L_m$) and the mutual capacitance ($C_m$).

$$V_{far\text{-}end} = \frac{1}{2} \cdot \left(\frac{C_m}{C_t} - \frac{L_m}{L_s}\right) \cdot t_d \cdot \frac{dV_s(t - t_d)}{dt} \quad \text{[Equation 2]}$$

($L_s$: inductance of the first line 411, $L_m$: mutual inductance between the first line 411 and the second line 412; $t_d$: delay time of the electrical signal)

Figure 5G:
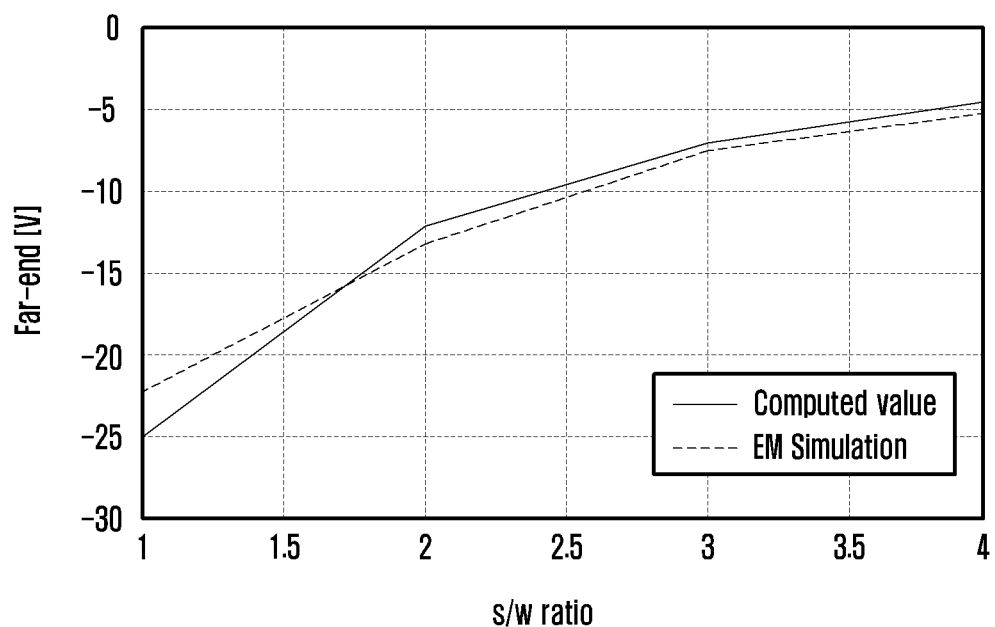

FIG. 5G is a graph of the voltage measured at the far-end 416 near the third electronic component 420 in relation to the standing wave ratio or s/w ratio of the second line 412.

It can be seen from FIG. 5G that the magnitude of the voltage measured at the far-end 416 decreases when the s/w ratio increases. Hence, in one embodiment, it is possible to adjust the magnitude of the voltage of the electrical signal sent to the third electronic component 420 by varying the s/w ratio at the time of design. For example, upon finding that the magnitude of the voltage of the electrical signal sent to the third electronic component 420 is too high, the designer may consider increasing the spacing between the first line 411 and the second line 412 or decreasing the length of the first line 411 and the second line 412.

Conversely, upon finding that the magnitude of the voltage of the electrical signal sent to the third electronic component 420 is too low, the designer may consider decreasing the spacing between the first line 411 and the second line 412 or increasing the length of the first line 411 and the second line 412.

Figure 5H:
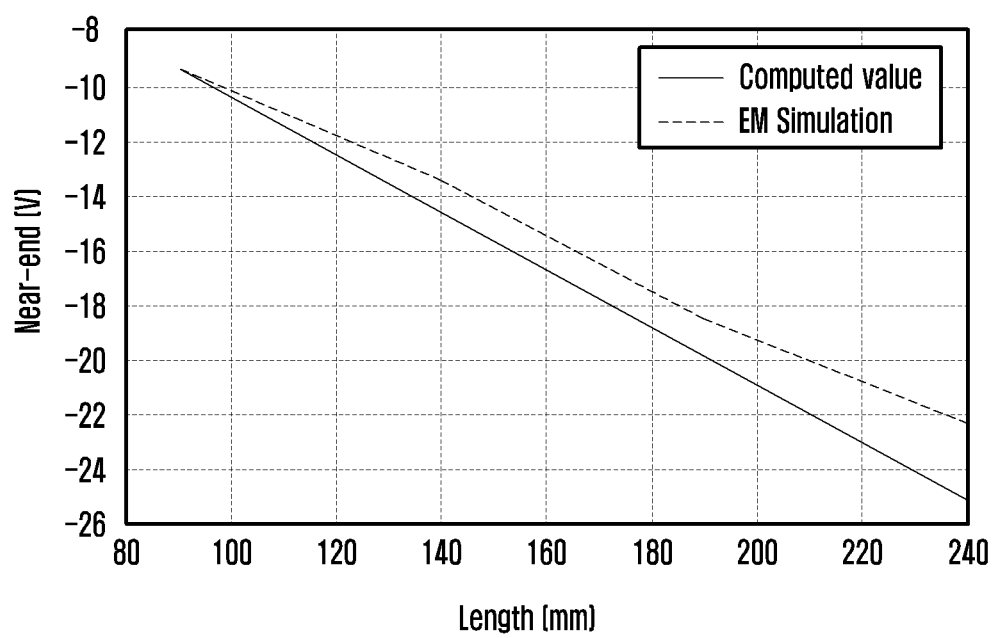

FIG. 5H is a graph of the voltage measured at the far-end 416 near the third electronic component 420 in relation to the length of the coupling region 415.

It can be seen from FIG. 5H that the magnitude of the voltage measured at the far-end 416 increases with the increasing length of the coupling region 415. Hence, in one embodiment, it is possible to adjust the magnitude of the voltage of the electrical signal sent to the third electronic component 420 by varying the length of the coupling region 415 at the time of design. For example, upon finding that the magnitude of the voltage of the electrical signal sent to the third electronic component 420 is too high, the designer may consider decreasing the length of the coupling region 415. Conversely, upon finding that the magnitude of the voltage of the electrical signal sent to the third electronic component 420 is too low, the designer may consider increasing the length of the coupling region 415.

Figure 6:
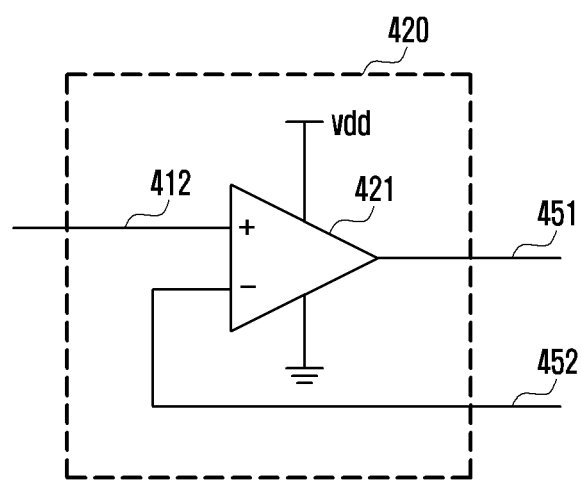
FIG. 6 illustrates a third electronic component of the electronic device shown in FIG. 4.

FIG. 6 is an example of the third electronic component 420 in FIG. 4.

Referring to FIG. 6, the third electronic component 420 may be implemented using a comparator 421.

The comparator 421 may compare the magnitude of the voltage of the electrical signal sent through the second line 412 with that of the reference signal.

The reference signal may be a signal transmitted through a line 452 connected between the second electronic component 430 and the third electronic component 420. The reference signal may also be a signal supplied by a power source internal to the third electronic component 420.

The reference signal may be predetermined based on the circuit design. For example, the voltage value of the reference signal may be less than that of the electrical signal is caused by ESD.

If the magnitude of the voltage of the electrical signal sent through the second line 412 is higher than that of the reference signal, the comparator 421 may generate an interrupt signal and send the interrupt signal through the line 451 to the second electronic component 430.

Upon reception of the interrupt signal, the second electronic component 430 may determine that ESD has occurred in the first electronic component 410.

In one embodiment, when ESD occurs in the first electronic component 410 and an electrical signal having a high voltage flows through the first line 411 due to the ESD, another electrical signal caused by the coupling effect between the first line 411 and the second line 412 may be sent through the second line 412 to the third electronic component 420. The third electronic component 420 may compare the electrical signal received through the second line 412 with the reference signal. If the magnitude of the voltage of the electrical signal received through the second line 412 is higher than that of the reference signal, the third electronic component 420 may generate an interrupt signal and send the interrupt signal to the second electronic component 430. Upon reception of the interrupt signal, the second electronic component 430 may determine that ESD has occurred in the first electronic component 410 and control the first electronic component 410 accordingly.

Although the comparator 421 of FIG. 6 is designed using an operational amplifier, it may be designed by using a different element. The arrangement of the inverting and non-inverting input terminals (+, −) may be reversed according to the circuit design.

FIGS. 7A to 8D show various examples of arrangement of the second line 412 in the electronic device according to one or more embodiments of the present disclosure.

Figure 7A:
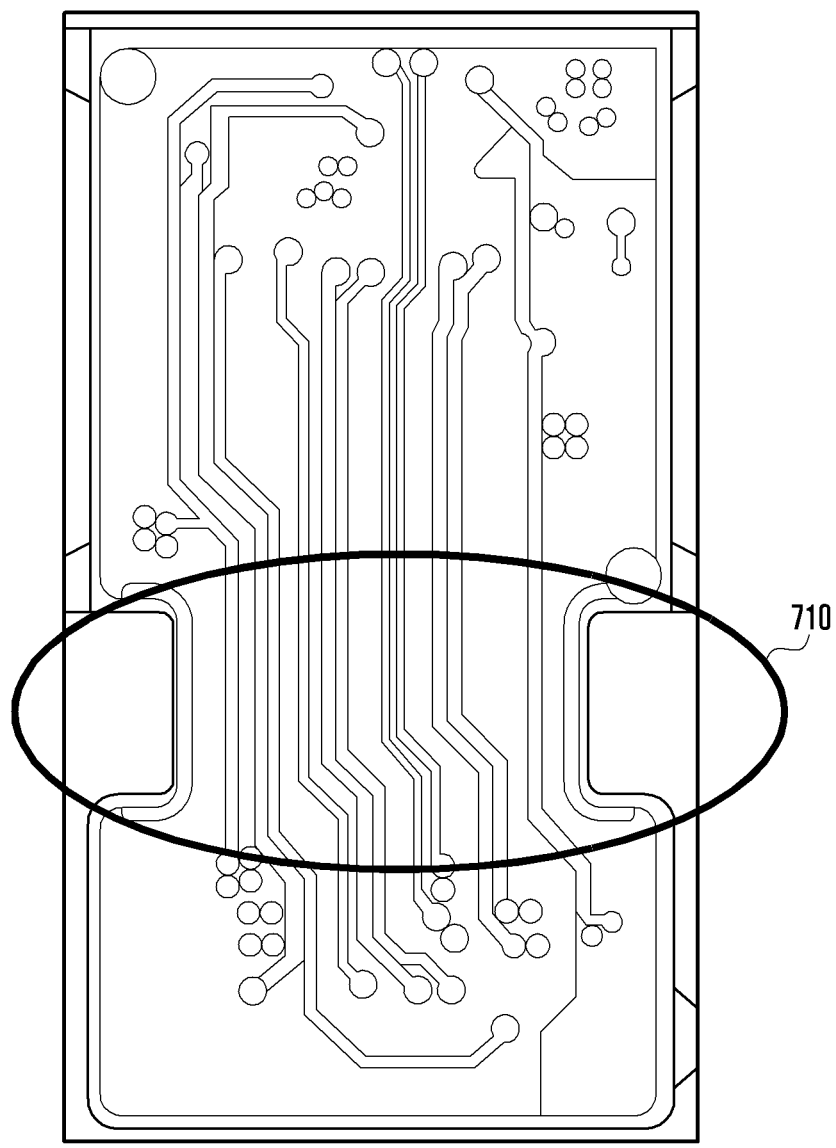
FIG. 7A and FIG. 7B illustrate circuit boards of the camera module in the electronic device according to one embodiment of the present disclosure.

FIG. 7A shows, among multiple layers of the flexible printed circuit board (FPCB) of a camera module, a layer on which lines or traces connecting the camera module and the second electronic component are printed.

Typically, the FPCB of the camera module includes four layers. In FIG. 7A, lines are printed parallel to each other for efficiency. In one embodiment, the second line 412 may be one of the parallel lines.

Figure 7B:
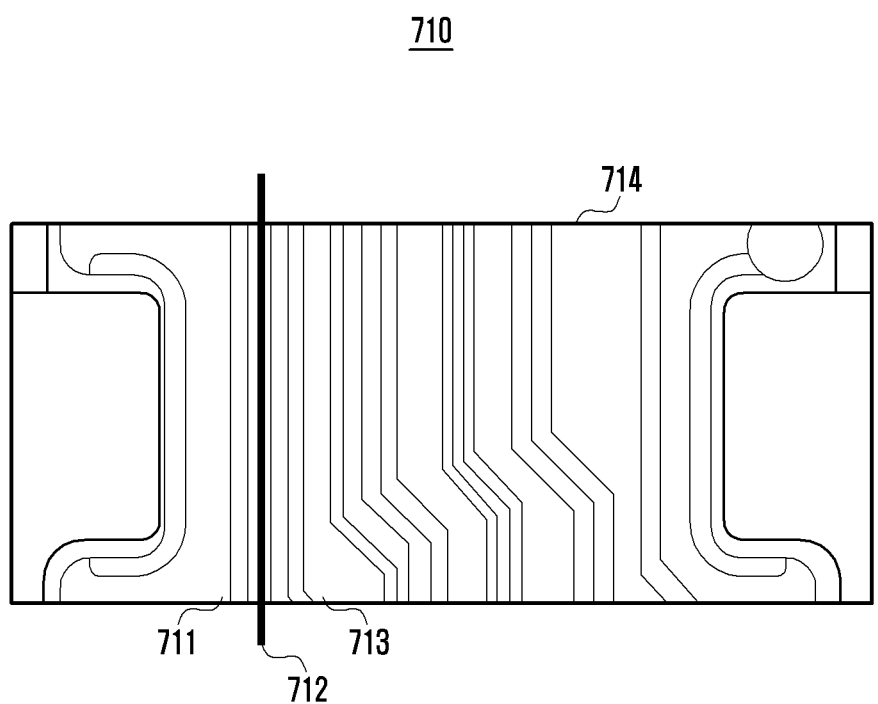

FIG. 7B is an enlarged view of the region indicated by indicia 710 in FIG. 7A. FIG. 7B shows multiple lines 711, 712 and 713 connecting the camera module and the second electronic component.

In one embodiment, when an electrical signal caused by ESD occurring in the camera module is transmitted through the lines 711 and 713, an electrical signal generated by a corresponding coupling effect may be sent through the line 712 to the third electronic component.

In one embodiment, among the lines connecting the camera module and the second electronic component, the line 712 may be connected to the third electronic component 420.

In one embodiment, a passive element may be disposed inside the camera module. The electrical signal caused by the coupling effect may experience a voltage drop due to the passive element and the magnitude of the voltage drop may be used to detect occurrence of an ESD.

Figure 8A:
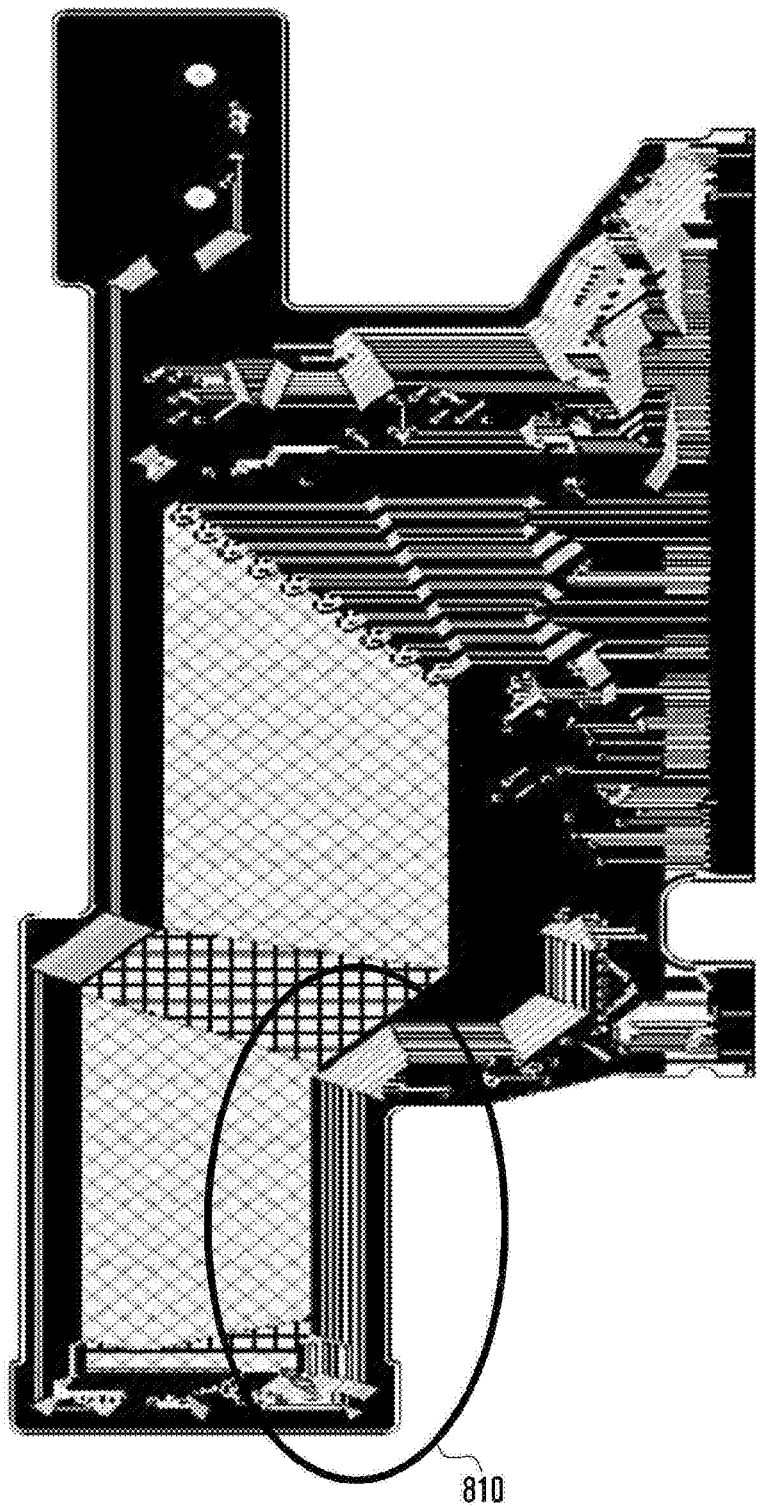
FIG. 8A, FIG. 8B, FIG. 8C and FIG. 8D illustrate circuit boards of the display in the electronic device according to one embodiment of the present disclosure.
Figure 8B:
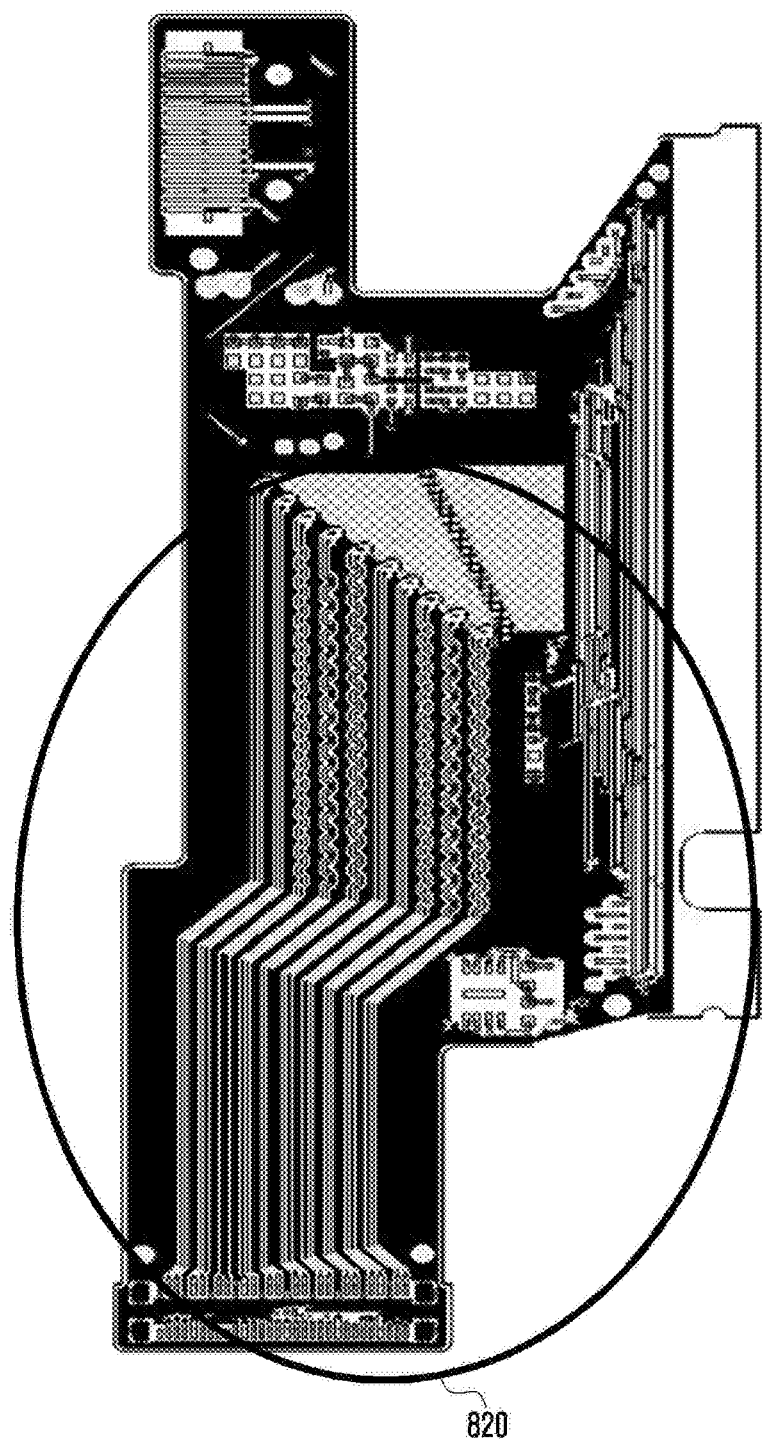
Figure 8C:
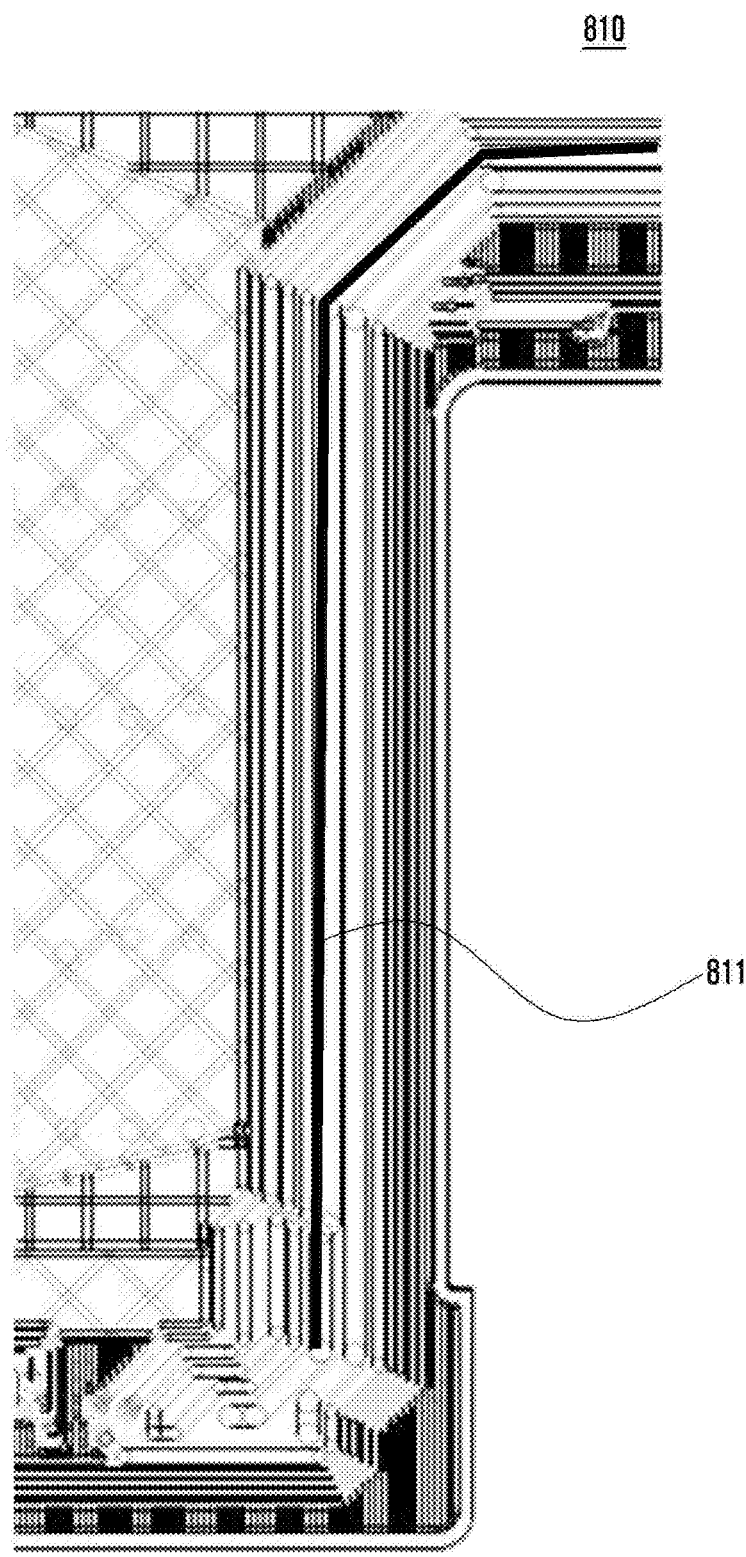
Figure 8D:
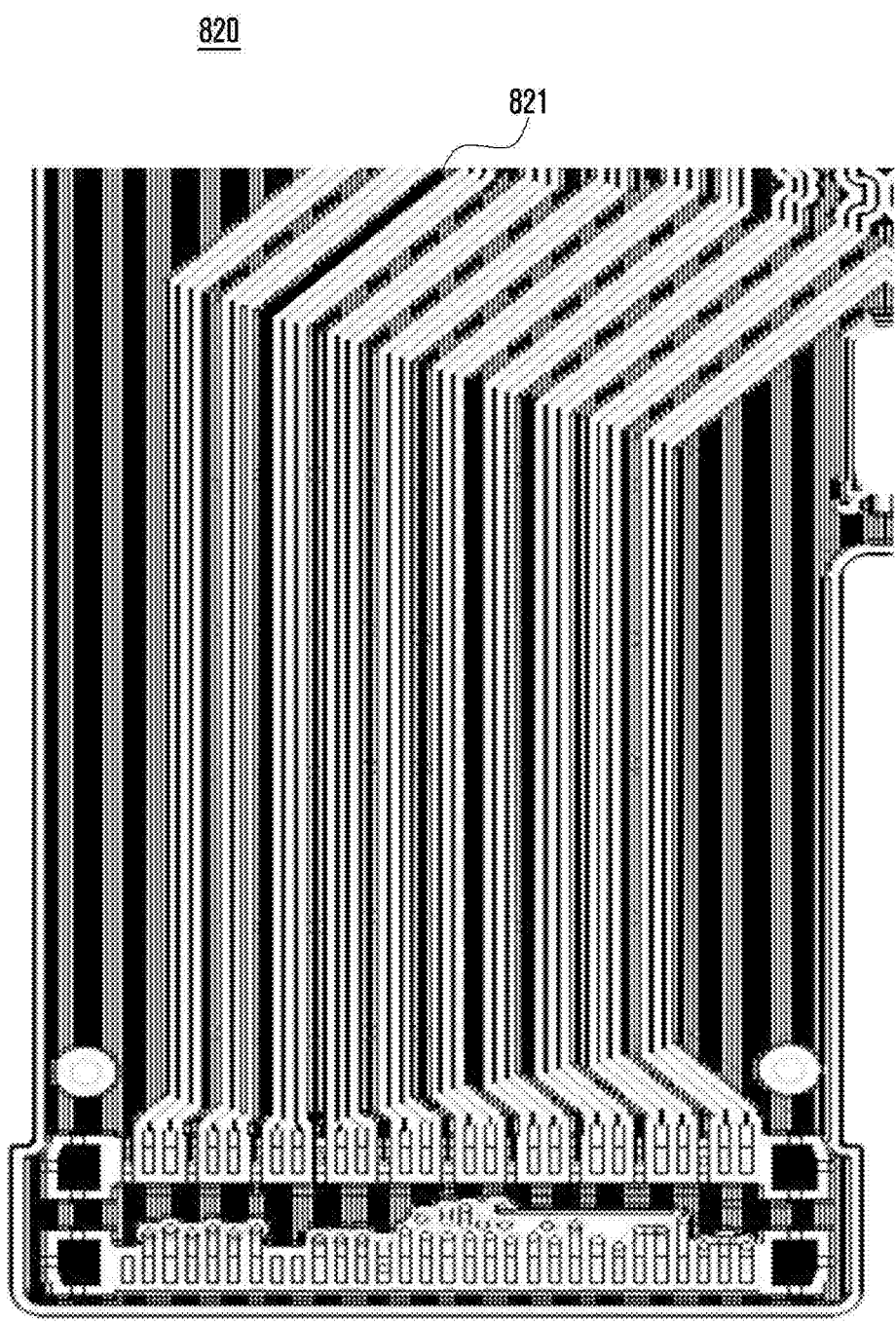

FIGS. 8A and 8C show two layers of the FPCB of a display driver module. FIG. 8B is an enlarged view of the wiring region 810 of FIG. 8A, and FIG. 8D is an enlarged view of the wiring region 820 of FIG. 8B.

In the electronic device, the display driver module and the third electronic component 420 may be connected using one or more of lines 811 and 821.

In one embodiment, when an electrical signal caused by ESD occurring in the display driver module is transmitted through one or more lines, an electrical signal generated by the corresponding coupling effect may be sent through the line 811 or 821 to the third electronic component.

In the above description of FIGS. 7A to 8D, the first electronic component is assumed to be one of the camera module and the display driver module. However, the present disclosure may also be applied to various other electronic components. In various embodiments, the first electronic component may refer to an electronic component internal to the electronic device, such as an electronic component of the display, an electronic component of the camera module, an electronic component of the memory, or an electronic component of large scale integrated circuits (LSI).

The present disclosure may be used when an element of the first electronic component is exposed to the exterior of the electronic device. For example, the camera lens of the camera module and the display of the display driver module are exposed to the exterior of the electronic device. The exposed element may experience more frequent ESDs compared with internal elements of the electronic device. When the present disclosure is used to the camera module or the display driver module, ESD occurrence may be accurately detected.

Figure 9A:
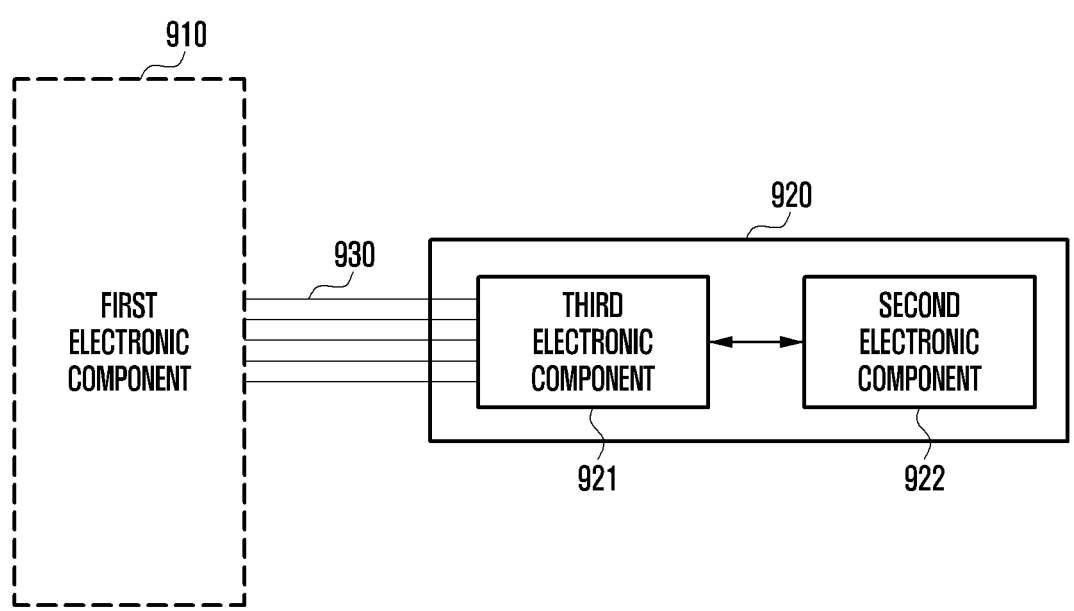
FIG. 9A, FIG. 9B and FIG. 9C illustrate the third electronic component separately disposed in the electronic device according to one or more embodiments of the present disclosure.
Figure 9B:
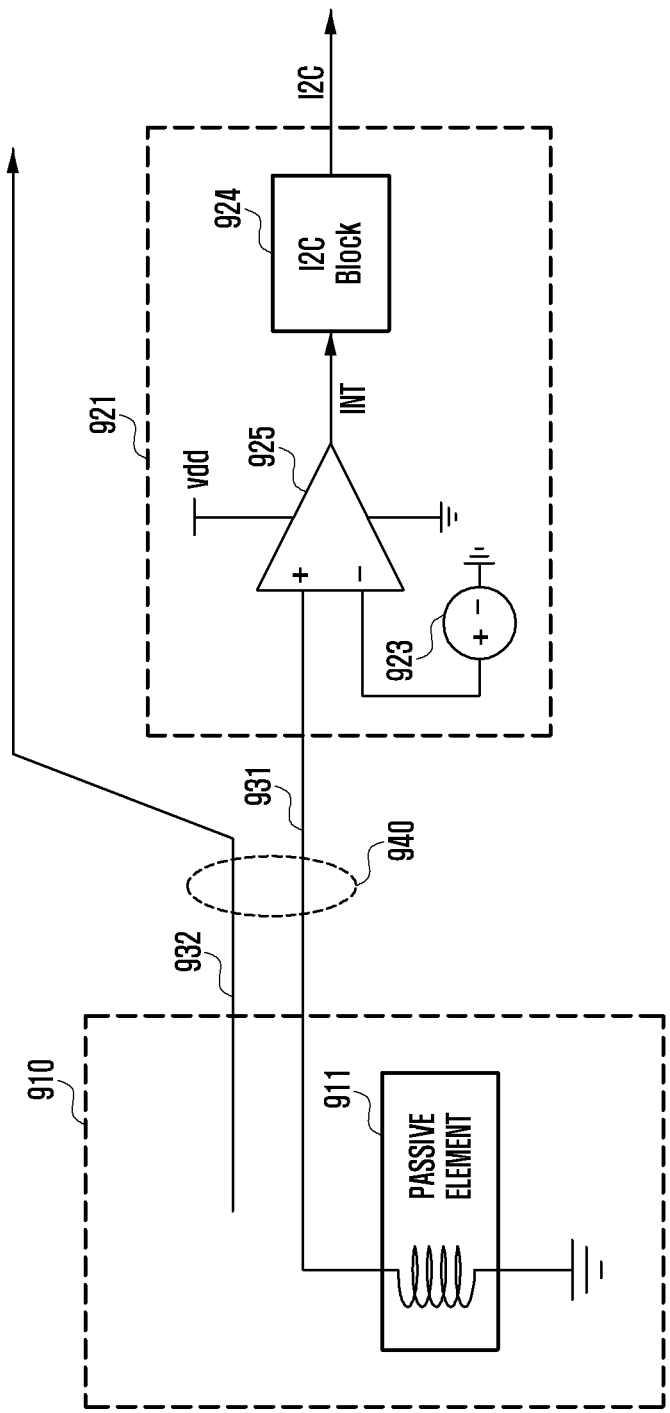
Figure 9C:
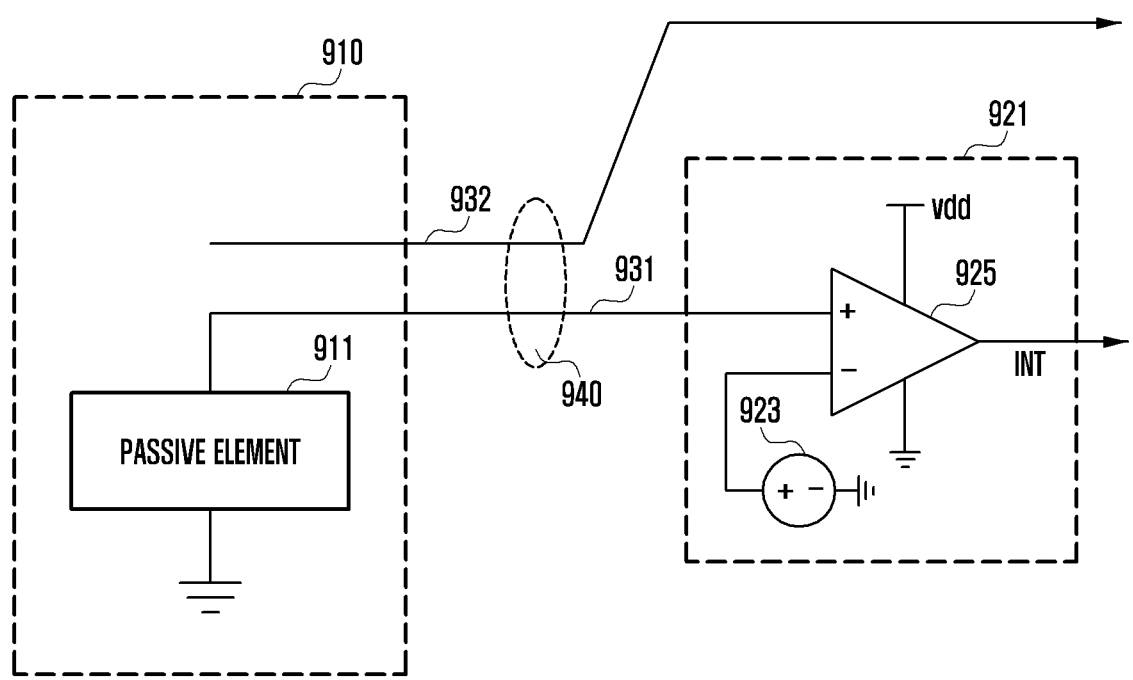

FIGS. 9A to 9C illustrate the third electronic component separately disposed in the electronic device according to one or more embodiments of the present disclosure.

Referring to FIG. 9A, the electronic device may include a first electronic component 910, a PCB 920, and transmission lines 930.

The PCB 920 may be used to mount internal components of the electronic device. In FIG. 9A, a third electronic component 921 and a second electronic component 922 are mounted on the PCB 920.

The first electronic component 910, the third electronic component 921, and the second electronic component 922 may be the same as those described in connection with FIG. 4, and a repeated description thereof is omitted.

FIG. 9B is a detailed view of the third electronic component 921 of FIG. 9A.

The third electronic component 921 may include a comparator 925, a power source 923, and an I2C block 924.

The electrical signal sent through the line 931 is generated from coupling to the line 932 carrying the data signal generated by the first electronic component 910 (coupling indicated by indicia 940). The comparator 925 may compare the electrical signal sent through the line 931 to the reference signal. The comparator 925 may be the same as that shown in FIG. 6.

In one embodiment, the voltage of the electrical signal may be generated by a voltage drop due to a passive element 911. The passive element 911 may be disposed inside the first electronic component 910.

The I2C block 924 may control communication between the third electronic component 921 and the second electronic component 922. The I2C block 924 may receive an interrupt signal produced by the comparator 925 and send the interrupt signal to the second electronic component 922 using Inter-Integrated Circuit communication.

The I2C block 924 may be omitted. FIG. 9C illustrates an electronic device without the I2C block 924 shown in FIG. 9B.

When the I2C block 924 is not present as in FIG. 9C, the interrupt signal produced by the comparator 925 may be directly sent to the second electronic component 922.

Although the third electronic component 921 is depicted as a separate entity from the first electronic component 910 or the second electronic component 922 in FIGS. 9A to 9C, the design of the third electronic component 921 can be varied. For example, the third electronic component 921 may be included in the first electronic component 910. The third electronic component 921 may also be included in the second electronic component 922. This is described below with reference to FIGS. 10A to 11B.

Figure 10A:
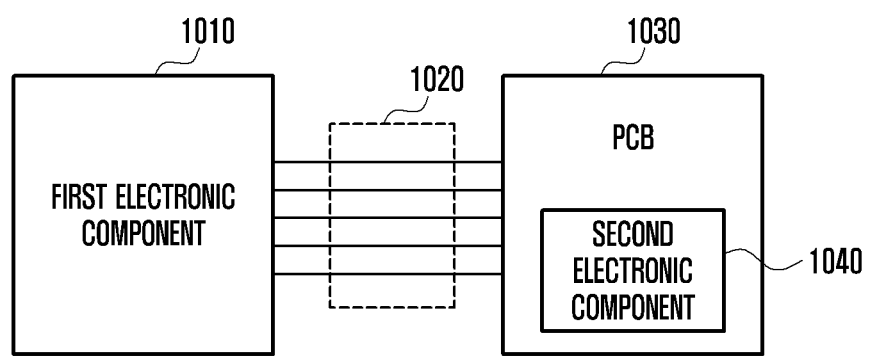
FIG. 10A and FIG. 10B illustrate the third electronic component disposed inside the application processor in the electronic device according to one embodiment of the present disclosure.

FIG. 10A illustrates an embodiment where the third electronic component is disposed inside the second electronic component in the electronic device.

Referring to FIG. 10A, the electronic device may include a first electronic component 1010, transmission lines 1020, a PCB 1030, and a second electronic component 1040.

The first electronic component 1010, transmission lines 1020, PCB 1030, and second electronic component 1040 may be the same as those described in connection with FIG. 4, and a repeated description thereof is omitted.

Although not shown in FIG. 10A, the third electronic component is included in the second electronic component 1040.

Figure 10B:
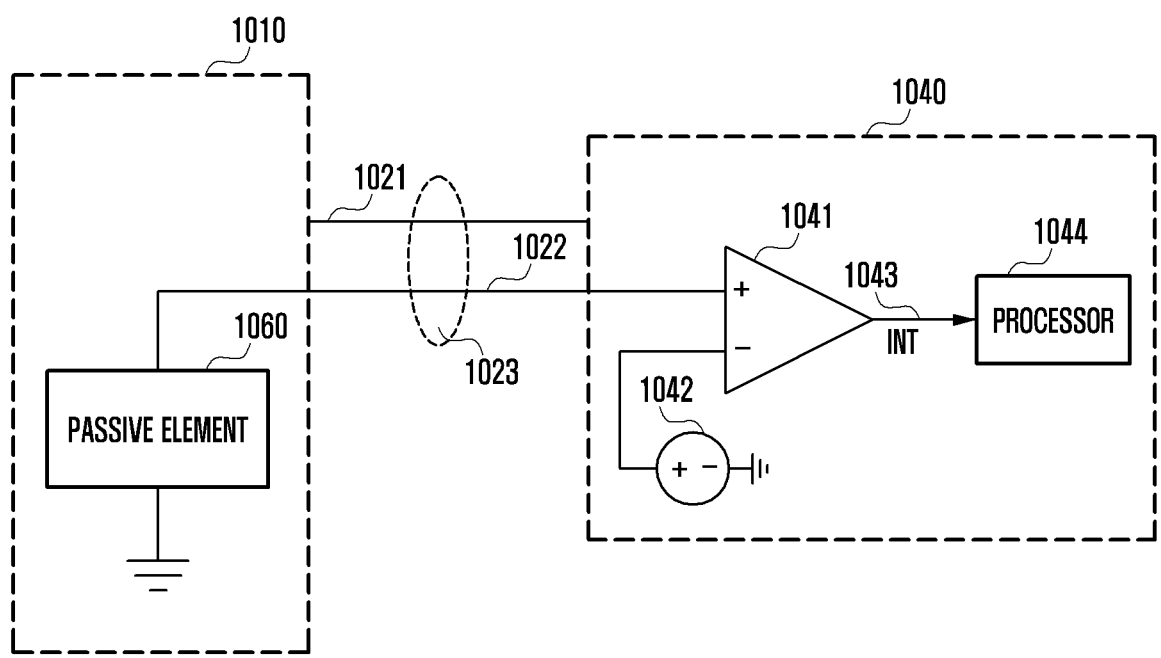

FIG. 10B is a detailed view of the second electronic component 1040 of FIG. 10A.

Referring to FIG. 10B, the second electronic component 1040 may include a comparator 1041, a power source 1042, a transmission line 1043, and a processor 1044.

The comparator 1041 may compare the electrical signal sent through the line 1022 (e.g. the signal caused by ESD) to the reference signal. The comparator 1041 may perform the same function as that shown in FIG. 6.

As described before, a voltage drop of the electrical signal in line 1022 may be generated by the passive element 1060. The passive element 1060 may be disposed inside the first electronic component 1010. The passive element 1060 may be changed or omitted according to the circuit design.

The power source 1042 may supply a reference signal to the comparator 1041.

The transmission line 1043 may be used to send an interrupt signal produced by the comparator 1041 to the processor 1044.

As shown in FIGS. 10A and 10B, the third electronic component may be embedded in the second electronic component 1040.

Figure 11A:
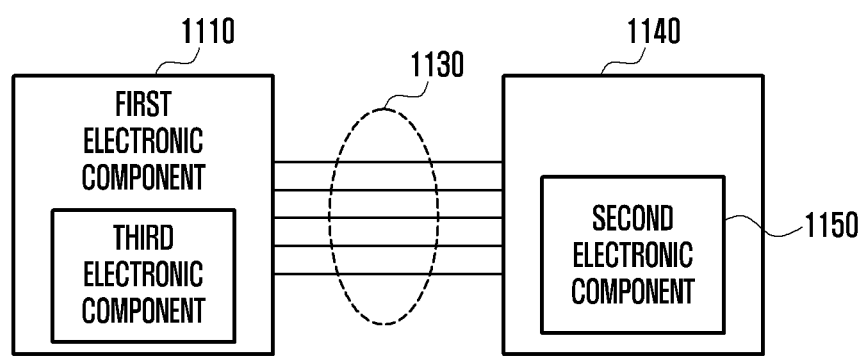
FIG. 11A and FIG. 11B illustrate the third electronic component disposed inside a module in the electronic device according to one embodiment of the present disclosure.
Figure 11B:
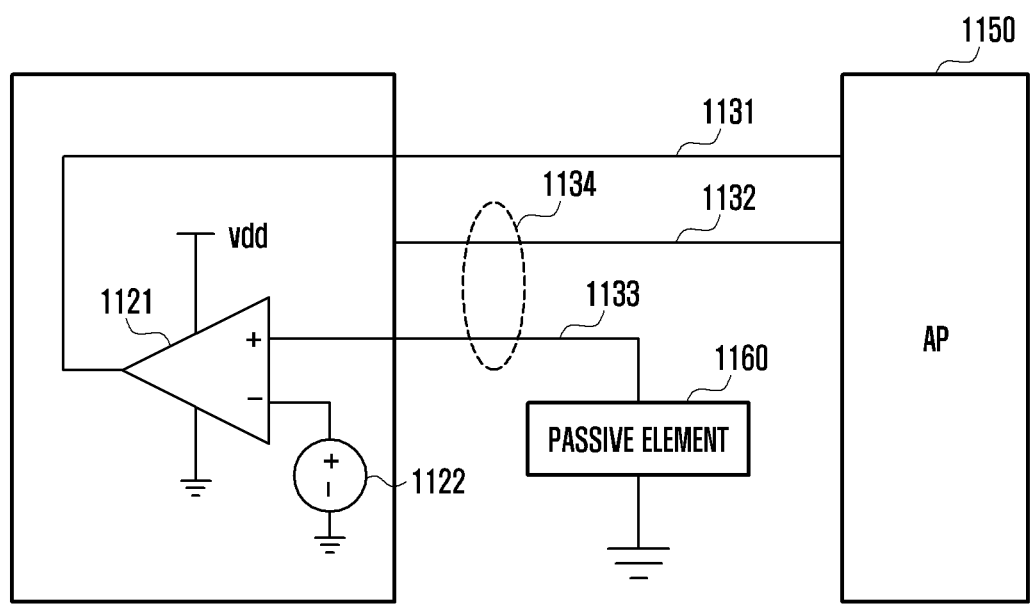

FIGS. 11A and 11B illustrate the third electronic component being disposed inside the first electronic component in the electronic device according to one embodiment of the present disclosure.

FIG. 11A illustrates an embodiment where the third electronic component 1120 is disposed inside the first electronic component 1110 in the electronic device. FIG. 11B is a detailed view of the first electronic component 1110 of FIG. 11A.

In FIG. 11B, the line 1133 may carry an electrical signal generated from coupling to with line 1132, which carries the data signal generated by the first electronic component 1110. The comparator 1121 may compare the electrical signal sent through the line 1133 to the reference signal in terms of voltage magnitude.

In one embodiment, a voltage drop of the electrical signal in line 1133 may be generated by a passive element 1160. The voltage drop may also be generated due to the resistance of the line 1133 itself.

The passive element 1160 may be omitted according to the circuit design.

The comparator 1121 may produce an interrupt signal based on the result of comparison between the electrical signal and the reference signal and send the interrupt signal through the line 1131 to the second electronic component 1150.

The passive element 1160 may be disposed close to a connector between the transmission lines 1130 and the first electronic component 1110. The passive element 1160 may also be disposed inside the first electronic component 1110.

As shown in FIGS. 11A and 11B, the third electronic component 1120 may be disposed inside the first electronic component 1110. In this case, three or more transmission lines are utilized, unlike the cases of FIGS. 9 and 10 where two or more transmission lines are utilized.

According to one or more embodiments of the present disclosure, an electronic device may include: a first electronic component; a second electronic component electrically connected to the first electronic component via a first line, where the second electronic component receives a data signal from the first electronic component via the first line; and a third electronic component electrically connected to the first electronic component via a second line and electrically connected to the second electronic component. At least a portion of the second line is substantially parallel to at least a portion of the first line. The third electronic component is configured to compare an electrical signal received via the second line to a reference signal and determine whether an electrostatic discharge (ESD) has occurred based on the comparison result, and the second electronic component is configured to control the first electronic component based on the determination result.

In one embodiment, the electrical signal in the second line may be caused by coupling between the first line and the second line.

In one embodiment, the third electronic component may compare the magnitude of the voltage of the electrical signal with that of the reference signal.

In one embodiment, the third electronic component may determine that ESD has occurred if the voltage magnitude of the electrical signal is greater than that of the reference signal and send the determination result to the second electronic component.

In one embodiment, upon the third electronic component determining that ESD has occurred, the second electronic component may determine, based on the data signal, whether an error has occurred in the first electronic component.

In one embodiment, upon determining that an error has occurred in the first electronic component, the second electronic component may reset the first electronic component.

In one embodiment, the third electronic component may determine that ESD has not occurred if the voltage magnitude of the electrical signal is not greater than that of the reference signal.

In one embodiment, the third electronic component may be embedded in one of the first electronic component and the second electronic component.

In one embodiment, the first electronic component may be one of a camera sensor and a display driver IC of the electronic device.

In one embodiment, the second line may be electrically connected to a passive element configured to cause a voltage drop in the electrical signal, and the second electronic component may include an application processor.

Figure 12:
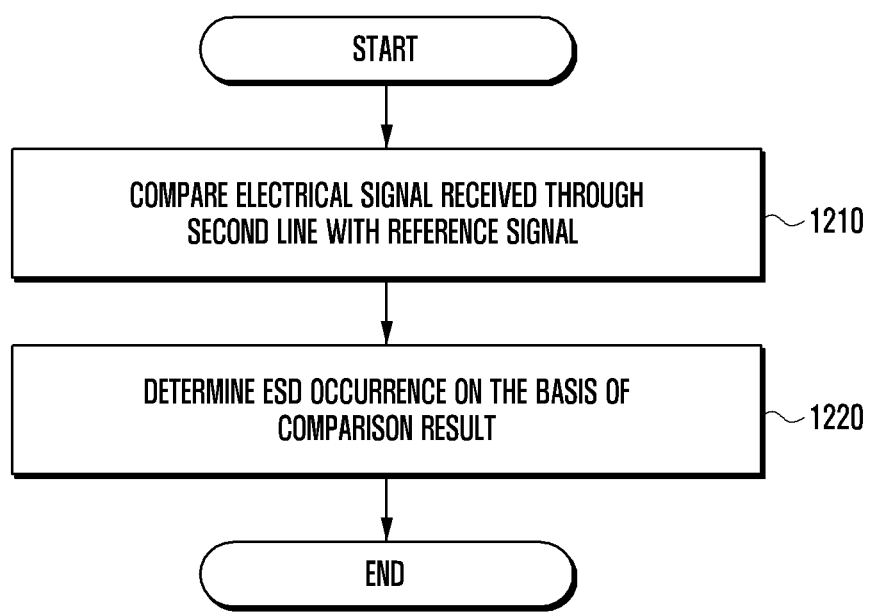
FIG. 12 is a flowchart of a method for operating the electronic device according to an embodiment of the present disclosure.

FIG. 12 is a flowchart of a method for operating the electronic device according to an embodiment of the present disclosure.

Referring to FIG. 12, in the operation method for the electronic device, at step 1210, the third electronic component 420 may compare the electrical signal received through the second line 412 with the reference signal.

The electrical signal along the second line 412 may be caused by an electrical signal flowing along the first line 411, which is coupled with the second line 412. For example, when the electrical signal corresponding to ESD occurring in the first electronic component 410 flows through the first line 411, an electrical signal may also flow through the second line 412 due to the coupling effect. The coupling effect is described in connection with FIGS. 5A to 5F.

At step 1220, the third electronic component 420 may determine whether ESD has occurred in the first electronic component 410 based on the result of comparison between the voltage magnitude of the electrical signal received through the second line 412 with that of the reference signal.

Figure 13:
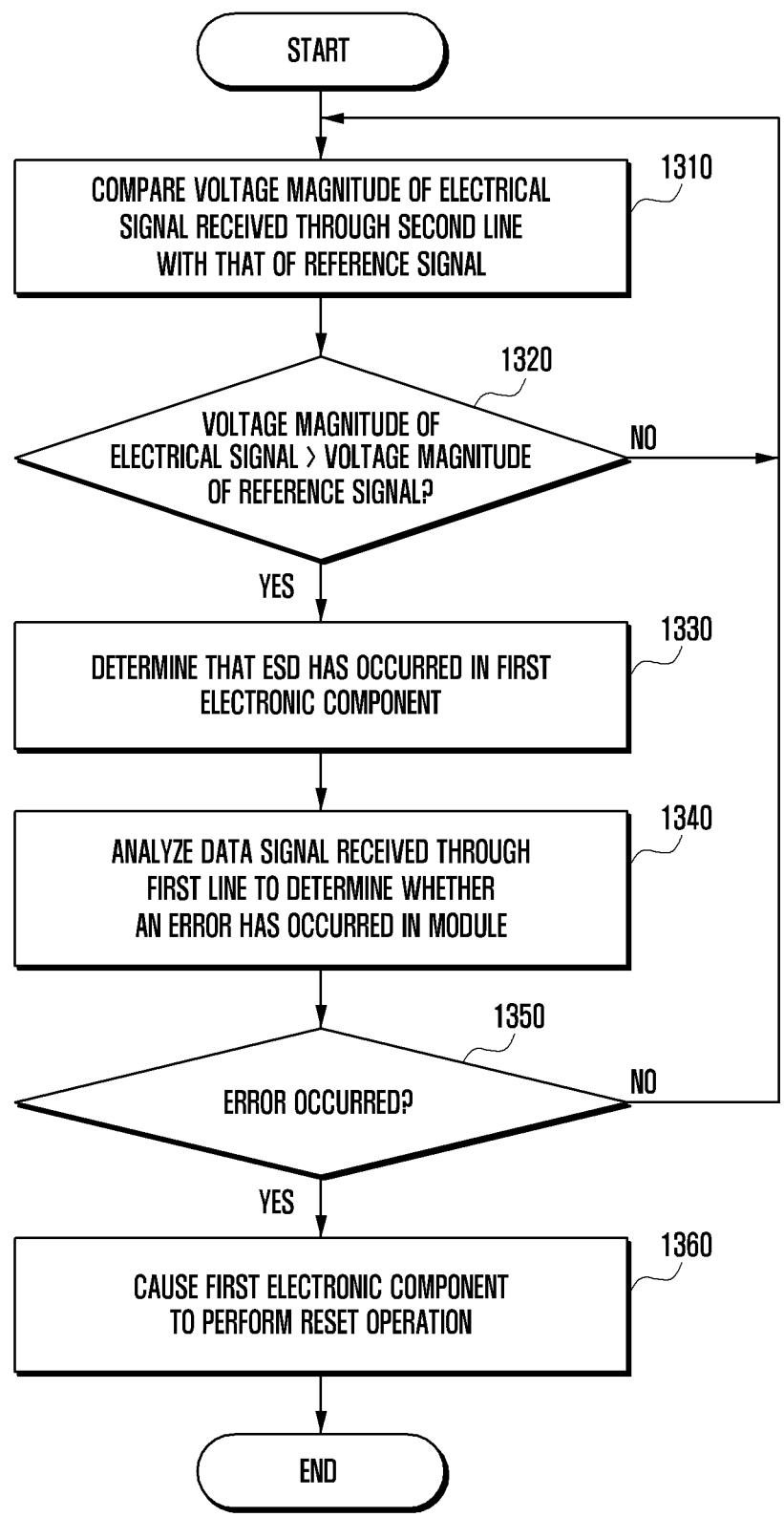
FIG. 13 is a flowchart of a method for operating the electronic device according to another embodiment of the present disclosure.

FIG. 13 is a flowchart of a method for operating the electronic device according to another embodiment of the present disclosure.

Compared with the flowchart of FIG. 12, the flowchart of FIG. 13 further describes operations of the second electronic component 430.

Referring to FIG. 13, at step 1310, the third electronic component 420 may compare the voltage magnitude of the electrical signal received through the second line 412 with that of the reference signal.

If the voltage magnitude of the electrical signal is greater than that of the reference signal, the procedure proceeds to step 1330 at which the second electronic component 430 may determine that ESD has occurred in the first electronic component 410.

Thereafter, at step 1340, the second electronic component 430 may analyze the data signal received through the first line 411 to determine whether an error has occurred in the first electronic component 410.

The second electronic component 430 may analyze the data signal in various ways. For example, when the first electronic component 410 is a display driver IC, a flag indicating error occurrence may be contained in the header part of the data signal sent by the first electronic component 410. In this case, the flag may be set to one value if an error has occurred and may be set to another value if no error has occurred. The second electronic component 430 may extract the flag value from the header part of the data signal and determine whether an error has occurred in the first electronic component 410 according to the flag value.

Upon determining that an error has occurred in the first electronic component 410, at step 1360, the second electronic component 430 may cause the first electronic component 410 to perform a reset operation.

According to various embodiments of the present disclosure, there is provided a method for operating an electronic device that includes a first line electrically connecting a first electronic component and a second electronic component, and a second line electrically connecting a third electronic component and the first electronic component and placed such that at least a portion of the second line is substantially parallel to at least a portion of the first line. The method may include: transmitting a data signal via the first line; comparing an electrical signal in the second line with a reference signal; determining, by the third electronic component, whether an electrostatic discharge (ESD) has occurred based on the comparison result; and controlling, by the second electronic component, the first electronic component based on the determination result.

In one embodiment, the electrical signal in the second line may be caused by coupling between the first line and the second line.

In one embodiment, comparing the electrical signal with the reference signal may include comparing the voltage magnitude of the electrical signal with that of the reference signal.

In one embodiment, determining whether ESD has occurred may include determining whether the voltage magnitude of the electrical signal is greater than that of the reference signal.

In one embodiment, upon the third electronic component determining that ESD has occurred, the method may further include: determining, by the second electronic device, whether an error has occurred in the first electronic component based on the data signal.

In one embodiment, upon determining that an error has occurred in the first electronic component, the method may further include resetting, by the second electronic component, the first electronic component.

In one embodiment, the third electronic component may determine that ESD has not occurred if the voltage magnitude of the electrical signal is not greater than that of the reference signal.

In one embodiment, the third electronic component may be embedded in one of the first electronic component and the second electronic component.

In one embodiment, the first electronic component may be one of a camera sensor and a display driver IC of the electronic device.

In one embodiment, the second line may be electrically connected to a passive element configured to cause a voltage drop in the electrical signal, and the second electronic component may include an application processor.

The above-discussed method is described herein with reference to flowchart illustrations, methods, and computer program products according to example embodiments of the present disclosure. It will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which are executed via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operations to be performed on the computer or other programmable apparatus to produce a computer implemented process such that the instructions that are executed on the computer or other programmable apparatus provide operations for implementing the functions specified in the flowchart block or blocks.

And each block of the flowchart illustrations may represent a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

Certain example aspects of the present disclosure can also be embodied as computer readable code on a non-transitory computer readable recording medium. A non-transitory computer readable recording medium is any data storage device that can store data which can be thereafter read by a computer system. Examples of the non-transitory computer readable recording medium include a ROM, a RAM, compact disc-ROMs (CD-ROMs), magnetic tapes, floppy disks, and optical data storage devices. The non-transitory computer readable recording medium can also be distributed over network coupled computer systems so that the computer readable code is stored and executed in a distributed fashion. In addition, functional programs, code, and code segments for accomplishing the present disclosure can be easily construed by programmers skilled in the art to which the present disclosure pertains.

At this point it should be noted that the various example embodiments of the present disclosure as described above typically involve the processing of input data and the generation of output data to some extent. This input data processing and output data generation may be implemented in hardware or software in combination with hardware. For example, specific electronic components may be employed in a mobile device or similar or related circuitry for implementing the functions associated with the various example embodiments of the present disclosure as described above. Alternatively, one or more processors operating in accordance with stored instructions may implement the functions associated with the various embodiments of the present disclosure as described above. If such is the case, it is within the scope of the present disclosure that such instructions may be stored on one or more non-transitory processor readable mediums. Examples of the processor readable mediums include a ROM, a RAM, CD-ROMs, magnetic tapes, floppy disks, and optical data storage devices. The processor readable mediums can also be distributed over network coupled computer systems so that the instructions are stored and executed in a distributed fashion. In addition, functional computer programs, instructions, and instruction segments for accomplishing the present disclosure can be easily construed by programmers skilled in the art to which the present disclosure pertains.

Aspects of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

While the present disclosure has been illustrated and described with reference to various example embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a first electronic component;
   a second electronic component electrically connected to the first electronic component via a first line, the second electronic component receiving a data signal from the first electronic component via the first line; and
   a third electronic component electrically connected to the first electronic component via a second line and electrically connected to the second electronic component, wherein at least a portion of the second line is substantially parallel to at least a portion of the first line, wherein the third electronic component is configured to:

compare an electrical signal received via the second line to a reference signal, the electrical signal being caused by coupling between the first line and the second line, determine whether an electrostatic discharge (ESD) has occurred based on the comparison result, and wherein the second electronic component is configured to control the first electronic component based on the determination result.

2. The electronic device of claim 1, wherein the third electronic component compares a voltage magnitude of the electrical signal with that of the reference signal.

3. The electronic device of claim 2, wherein the determination of whether the ESD has occurred is based on whether the voltage magnitude of the electrical signal is greater than that of the reference signal, and wherein the third electronic component is further configured to transmit the determination result to the second electronic component.

4. The electronic device of claim 3, wherein, upon the third electronic component determining that the ESD has occurred, the second electronic component determines, based on the data signal, whether an error has occurred in the first electronic component.

5. The electronic device of claim 4, wherein, upon determining that the error has occurred in the first electronic component, the second electronic component resets the first electronic component.

6. The electronic device of claim 2, wherein the third electronic component determines that the ESD has not occurred if the voltage magnitude of the electrical signal is not greater than that of the reference signal.

7. The electronic device of claim 1, wherein the third electronic component is embedded in one of the first electronic component and the second electronic component.

8. The electronic device of claim 1, wherein the first electronic component is one of a camera sensor and a display driver integrated circuit (IC) of the electronic device.

9. The electronic device of claim 1, wherein the second line is electrically connected to a passive element configured to cause a voltage drop in the electrical signal, and wherein the second electronic component includes an application processor.

10. A method for operating an electronic device, which includes a first line electrically connecting a first electronic component and a second electronic component, and a second line electrically connecting a third electronic component and the first electronic component and placed such that at least a portion of the second line is substantially parallel to at least a portion of the first line, the method comprising:

transmitting a data signal via the first line;

comparing an electrical signal in the second line with a reference signal, the electrical signal being caused by coupling between the first line and the second line;

determining, by the third electronic component, whether an electrostatic discharge (ESD) has occurred based on the comparison result; and controlling, by the second electronic component, the first electronic component based on the determination result.

11. The method of claim 10, wherein the comparing of the electrical signal with the reference signal comprises comparing a voltage magnitude of the electrical signal with that of the reference signal.

12. The method of claim 11, wherein the determining of whether the ESD has occurred comprises determining whether the voltage magnitude of the electrical signal is greater than that of the reference signal.

13. The method of claim 12, further comprising:

upon the third electronic component determining that the ESD has occurred, determining, by the second electronic component, whether an error has occurred in the first electronic component based on the data signal.

14. The method of claim 13, further comprising, upon determining that the error has occurred in the first electronic component, resetting, by the second electronic component, the first electronic component.

15. The method of claim 11, further comprising determining that the ESD has not occurred if the voltage magnitude of the electrical signal is not greater than that of the reference signal.

16. The method of claim 10, wherein the third electronic component is embedded in one of the first electronic component and the second electronic component.

17. The method of claim 10, wherein the first electronic component is one of a camera sensor and a display driver integrated circuit (IC) of the electronic device.

18. The method of claim 10, wherein the second line is electrically connected to a passive element configured to cause a voltage drop in the electrical signal, and wherein the second electronic component includes an application processor.

* * * * *